(12) United States Patent
Lim et al.

(10) Patent No.: US 12,416,830 B2
(45) Date of Patent: Sep. 16, 2025

(54) LIGHTING DEVICE AND VEHICLE LAMP HAVING SAME

(71) Applicant: LG INNOTEK CO., LTD., Seoul (KR)

(72) Inventors: Eay Jin Lim, Seoul (KR); Seong Jin Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/690,808

(22) PCT Filed: Sep. 16, 2022

(86) PCT No.: PCT/KR2022/013860
§ 371 (c)(1),
(2) Date: Mar. 11, 2024

(87) PCT Pub. No.: WO2023/043253
PCT Pub. Date: Mar. 23, 2023

(65) Prior Publication Data
US 2025/0004325 A1    Jan. 2, 2025

(30) Foreign Application Priority Data

Sep. 17, 2021    (KR) .................. 10-2021-0125300

(51) Int. Cl.
*G02F 1/13357* (2006.01)
*F21S 43/239* (2018.01)
(Continued)

(52) U.S. Cl.
CPC ...... *G02F 1/133603* (2013.01); *F21S 43/239* (2018.01); *F21S 43/245* (2018.01);
(Continued)

(58) Field of Classification Search
CPC ......... G02F 1/133603; G02F 1/133615; G02F 1/133605; G02F 1/133606; G02B 6/0055;
(Continued)

(56) References Cited

U.S. PATENT DOCUMENTS

2011/0261286 A1* 10/2011 Choi ................. G02F 1/133611
349/61
2012/0106147 A1* 5/2012 Kim .................... G02B 6/0051
362/235

(Continued)

FOREIGN PATENT DOCUMENTS

JP          5631776       11/2014
KR    10-2011-0126839    11/2011
(Continued)

*Primary Examiner* — Erin Kryukova
(74) *Attorney, Agent, or Firm* — KED & ASSOCIATES, LLP

(57) ABSTRACT

The lighting device disclosed at an embodiment of the invention includes a substrate; a first reflective layer disposed on the substrate and having a plurality of reflection patterns; a light source disposed on the substrate; a resin layer disposed on the first reflective layer, and a second reflective layer disposed on the resin layer and having a plurality of holes, wherein an arrangement form of the plurality of holes is the same as that of the plurality of reflection patterns.

18 Claims, 15 Drawing Sheets

(51) Int. Cl.
*F21S 43/245* (2018.01)
*F21S 43/249* (2018.01)
*F21V 8/00* (2006.01)

(52) U.S. Cl.
CPC ......... *G02B 6/0055* (2013.01); *G02B 6/0061* (2013.01); *G02F 1/133605* (2013.01); *F21S 43/249* (2018.01)

(58) Field of Classification Search
CPC .... G02B 6/0061; G02B 6/004; G02B 6/0058; G02B 6/006; F21S 43/239; F21S 43/245; F21S 43/249; F21V 7/22; F21V 7/05; F21V 7/0008; F21V 11/14
See application file for complete search history.

(56) References Cited

U.S. PATENT DOCUMENTS

| | | | |
|---|---|---|---|
| 2012/0327330 A1 | 12/2012 | Takahashi et al. | |
| 2013/0002938 A1 | 1/2013 | Kim | |
| 2013/0235577 A1* | 9/2013 | Park | G02B 6/0021 362/235 |
| 2020/0218004 A1 | 7/2020 | Yoon et al. | |
| 2020/0285115 A1* | 9/2020 | Ito | G02B 6/0043 |

FOREIGN PATENT DOCUMENTS

| | | | |
|---|---|---|---|
| KR | 20120036053 A | * | 4/2012 |
| KR | 10-2012-0057179 | | 6/2012 |
| KR | 10-2013-0007247 | | 1/2013 |
| KR | 10-2013-0096140 | | 8/2013 |
| KR | 10-2014-0059448 | | 5/2014 |
| KR | 10-2020-0036578 | | 4/2020 |
| KR | 10-2020-0086767 | | 7/2020 |
| TW | 1526740 B | * | 3/2016 |

* cited by examiner

[FIG. 1]
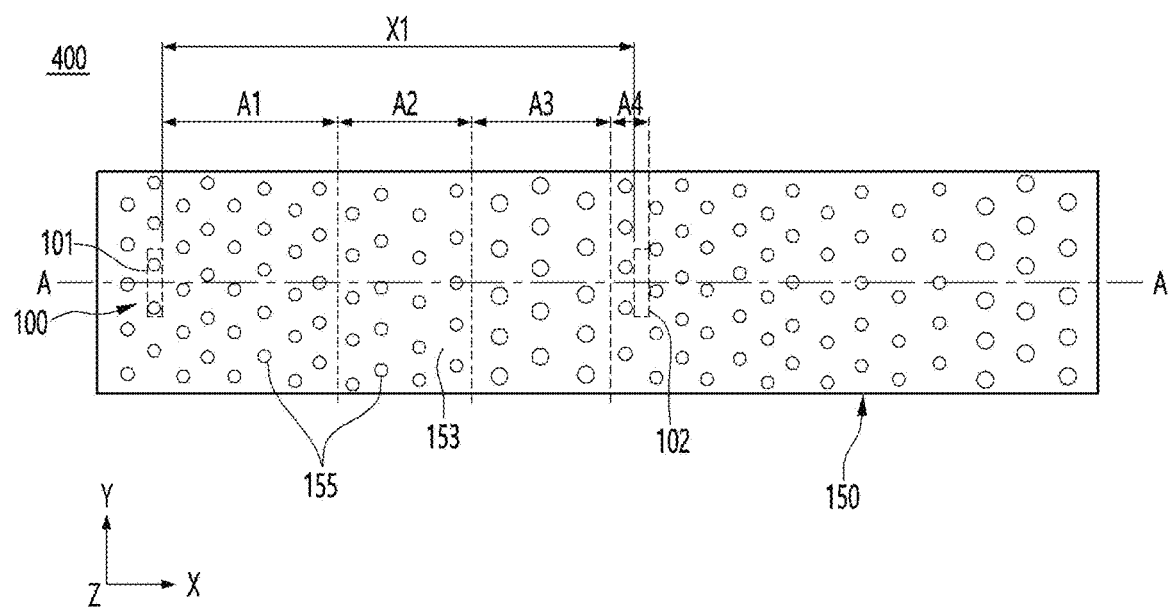
[FIG. 2]
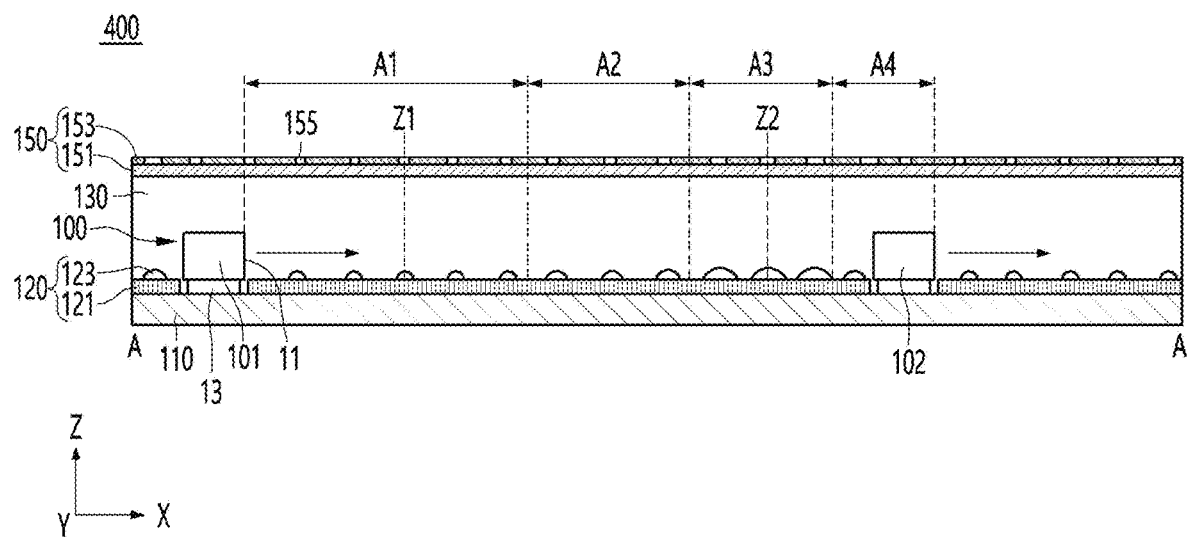

[FIG. 3]
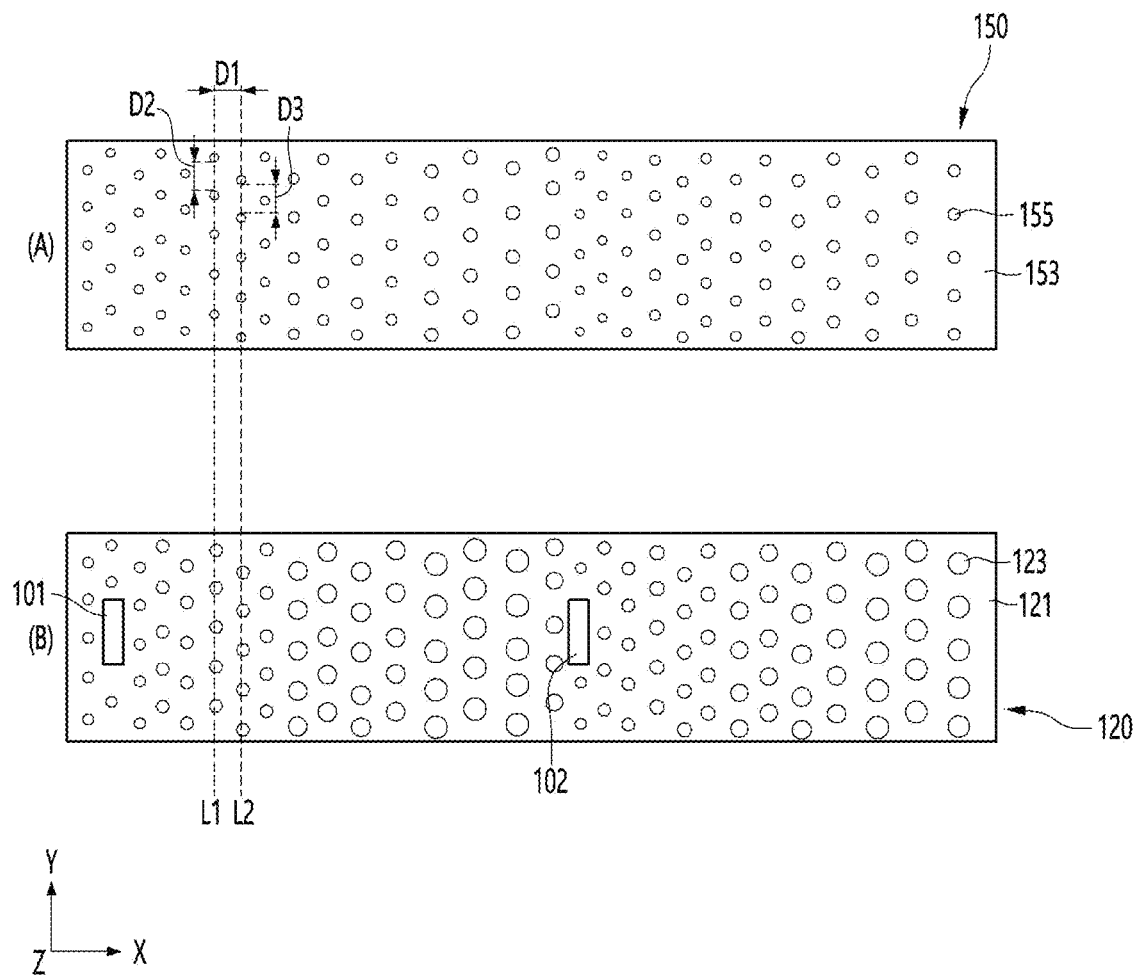
[FIG. 4]
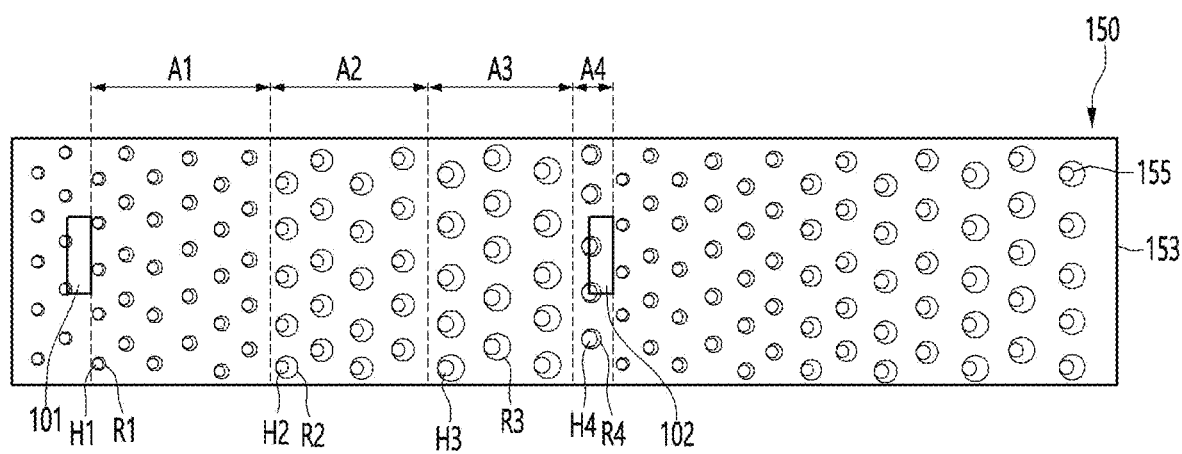

[FIG. 5]
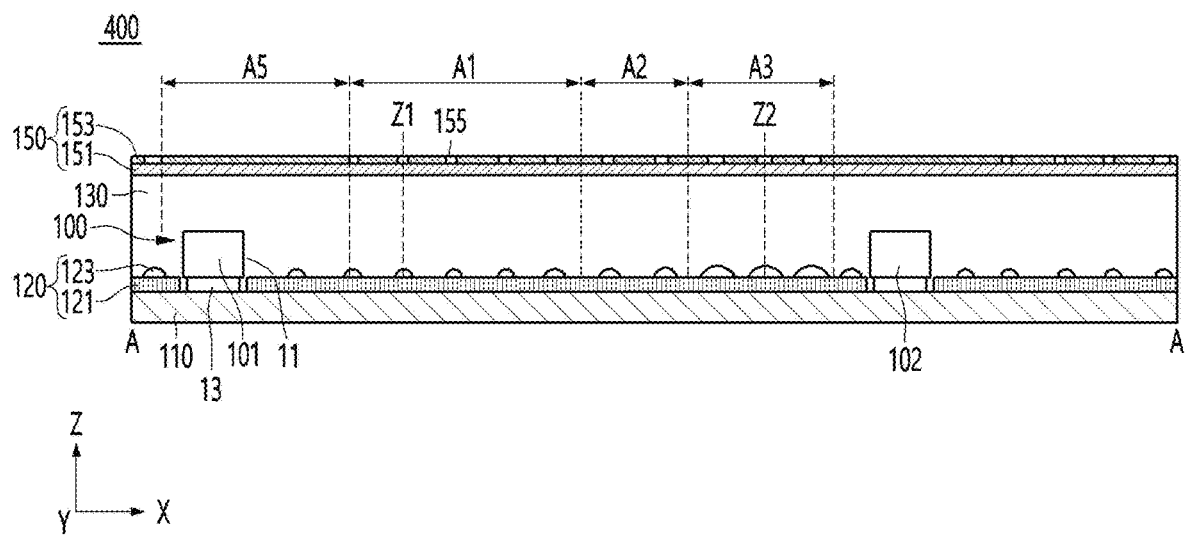
[FIG. 6]
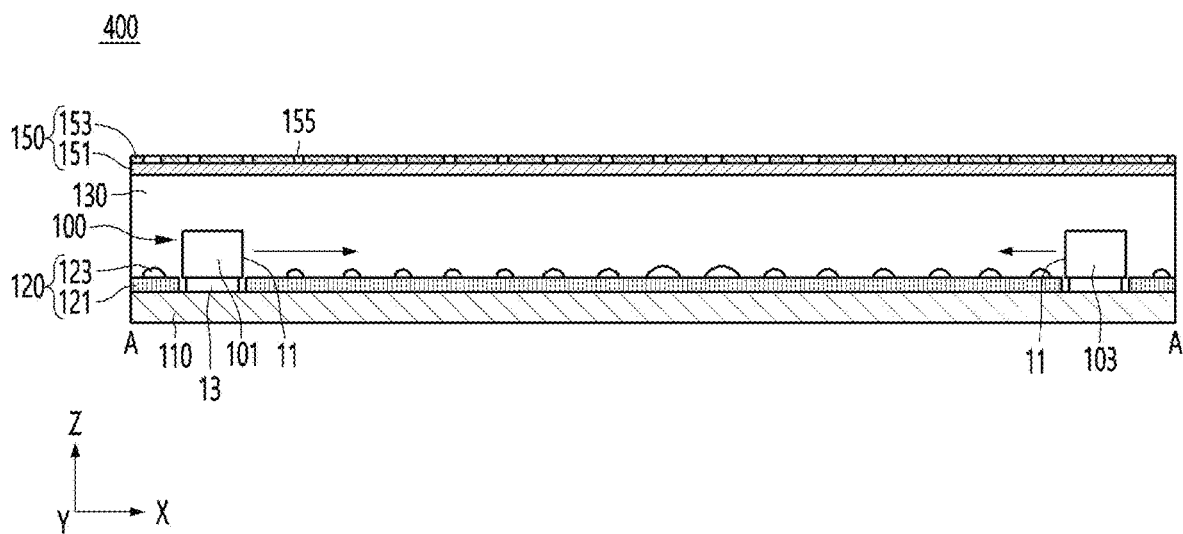

[FIG. 7]
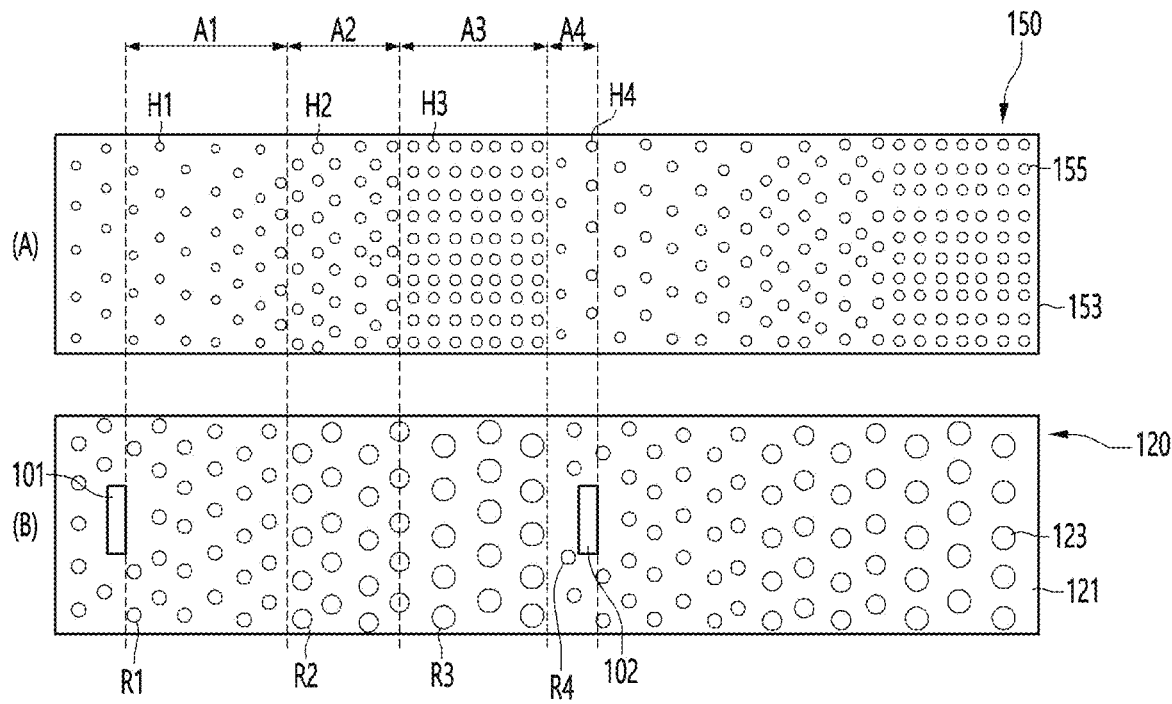
[FIG. 8]
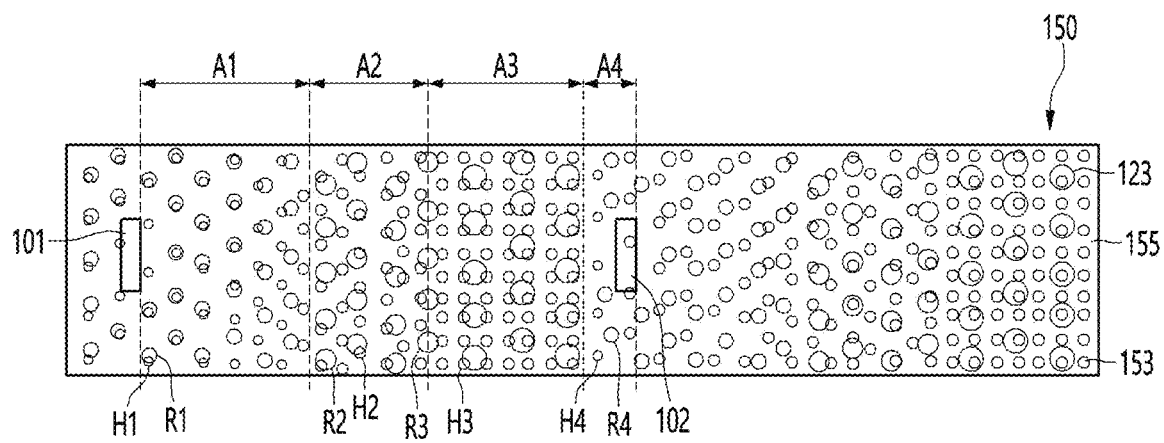

[FIG. 9]
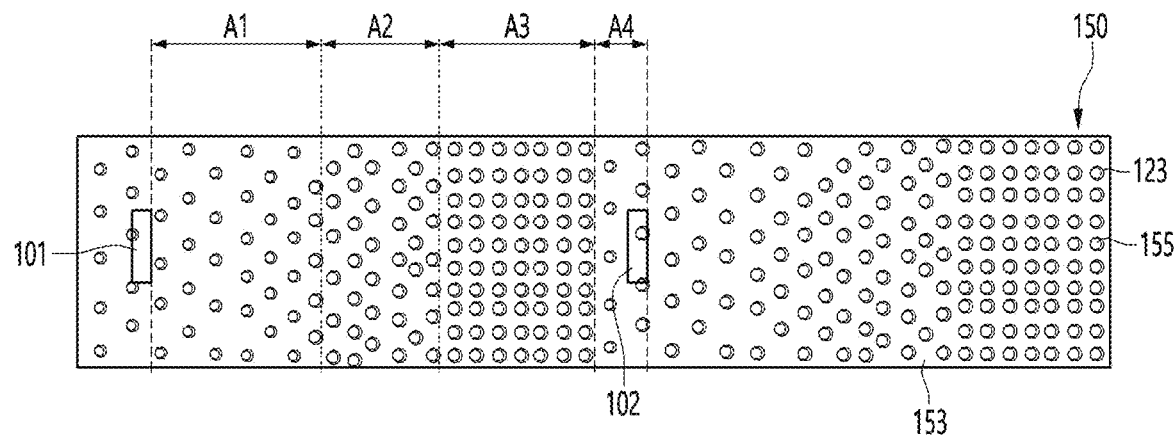
[FIG. 10]
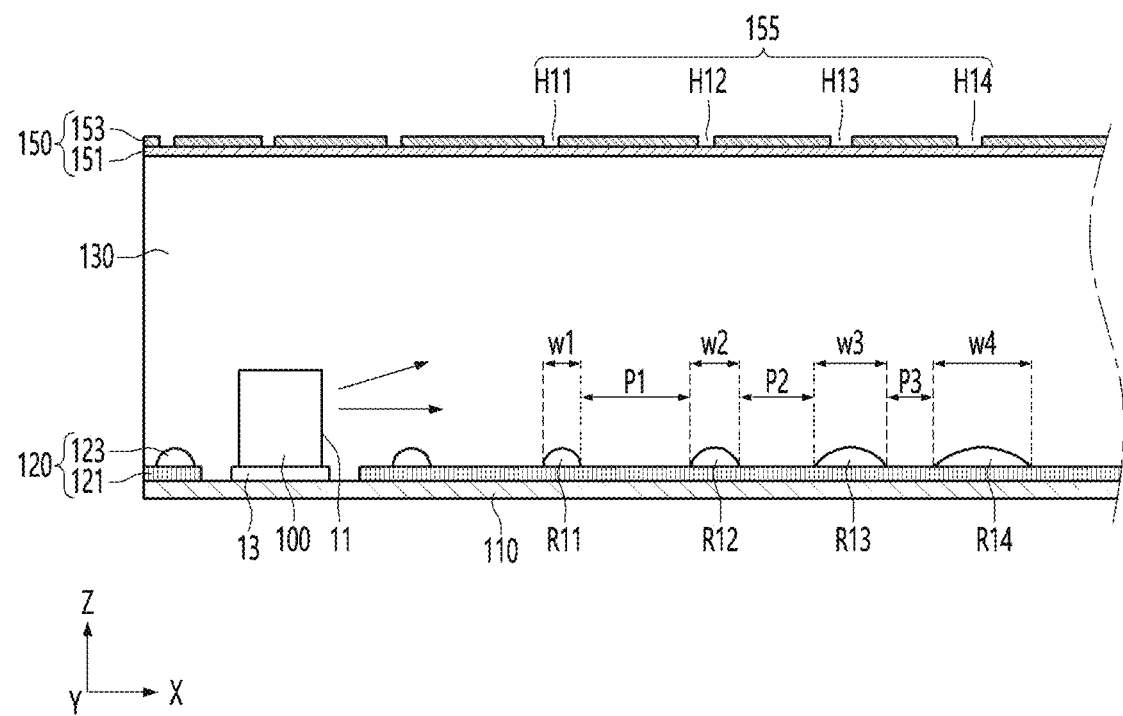

[FIG. 11]
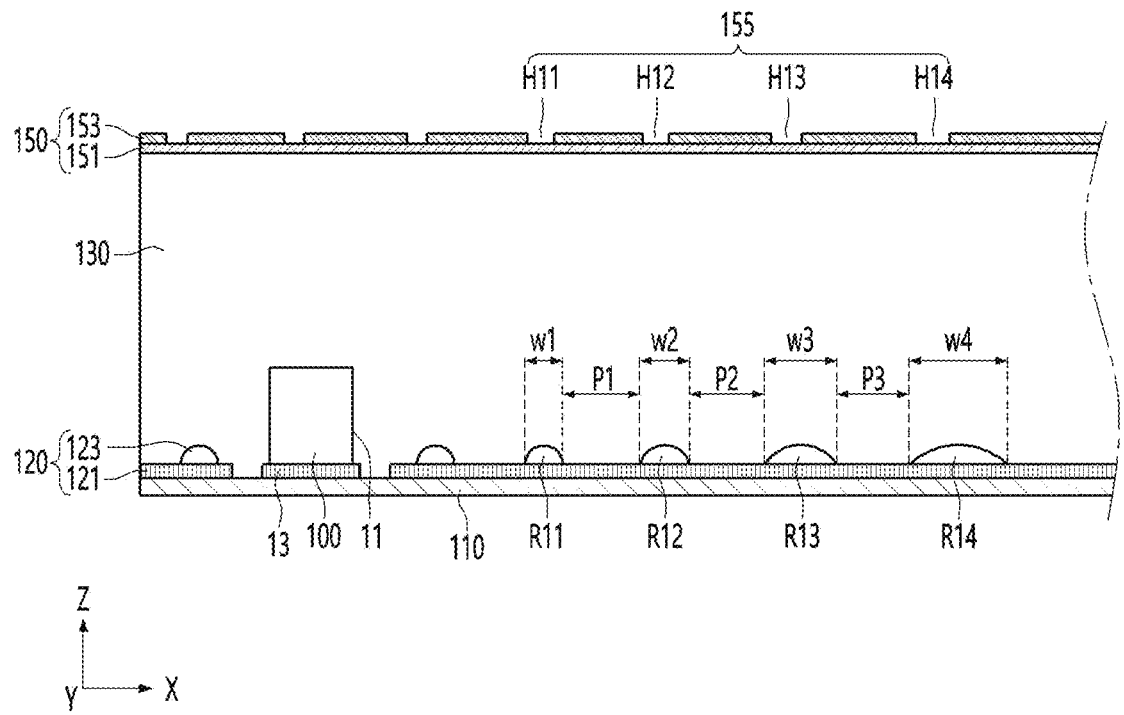
[FIG. 12]
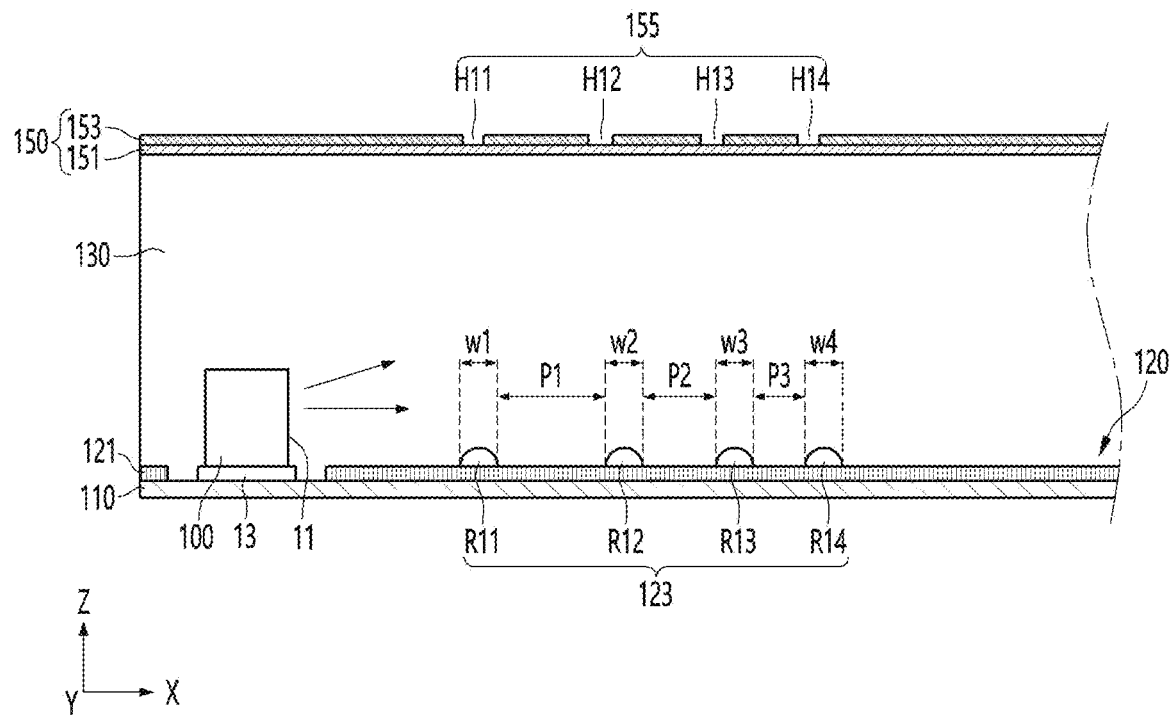

[FIG. 13]
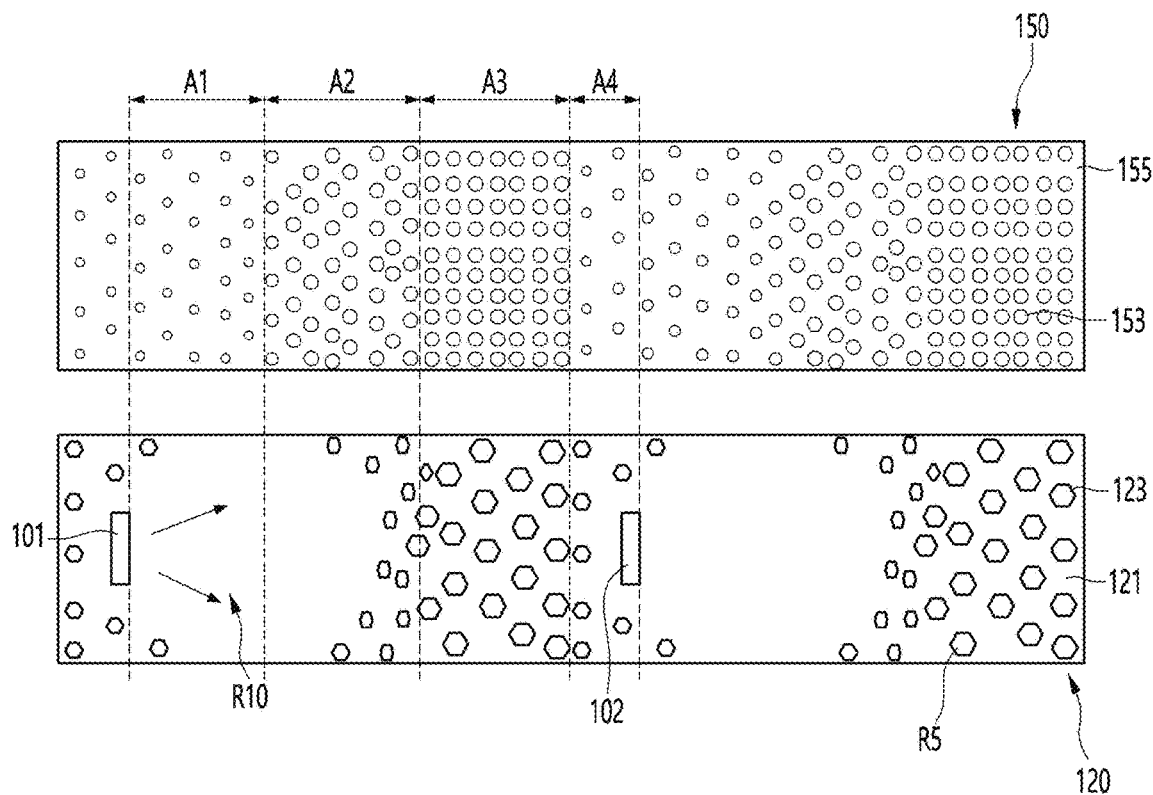
[FIG. 14]
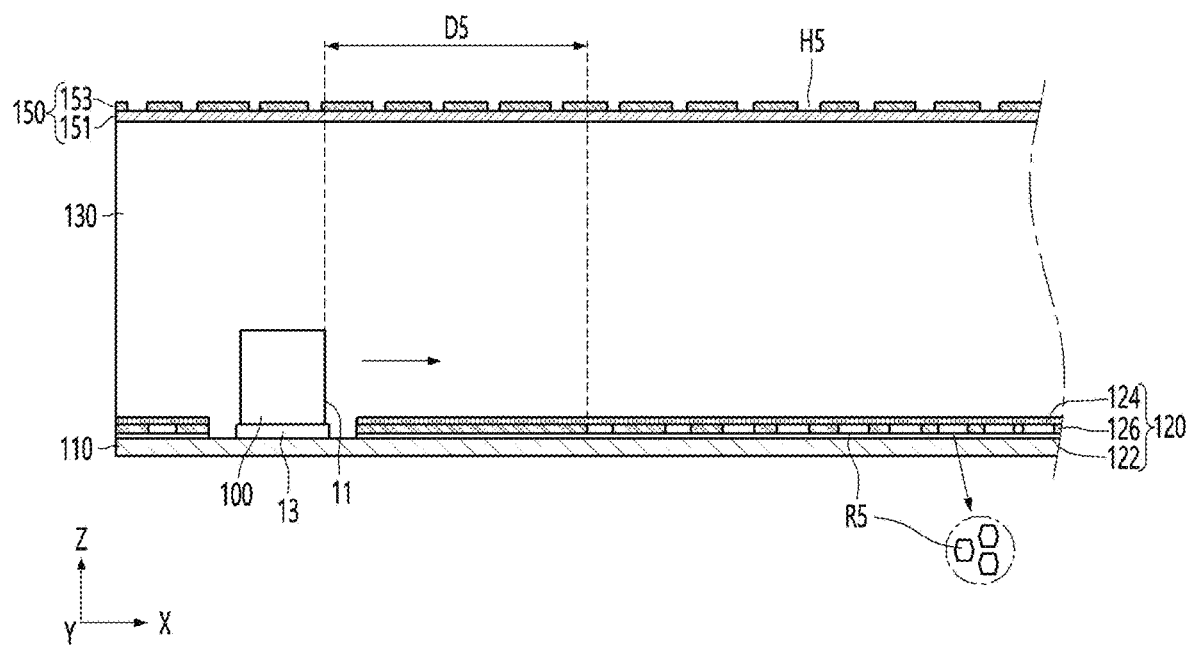

[FIG. 15]
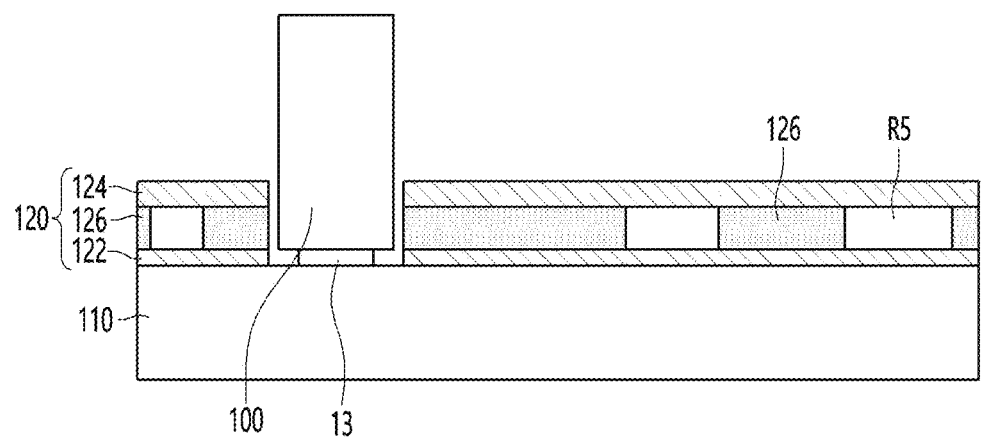
[FIG. 16]
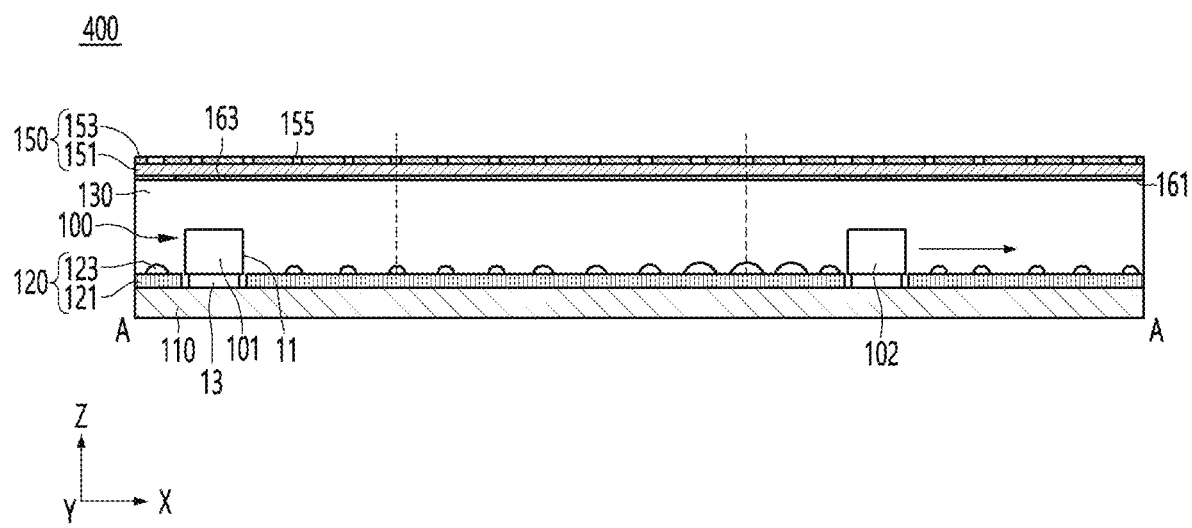

[FIG. 17]
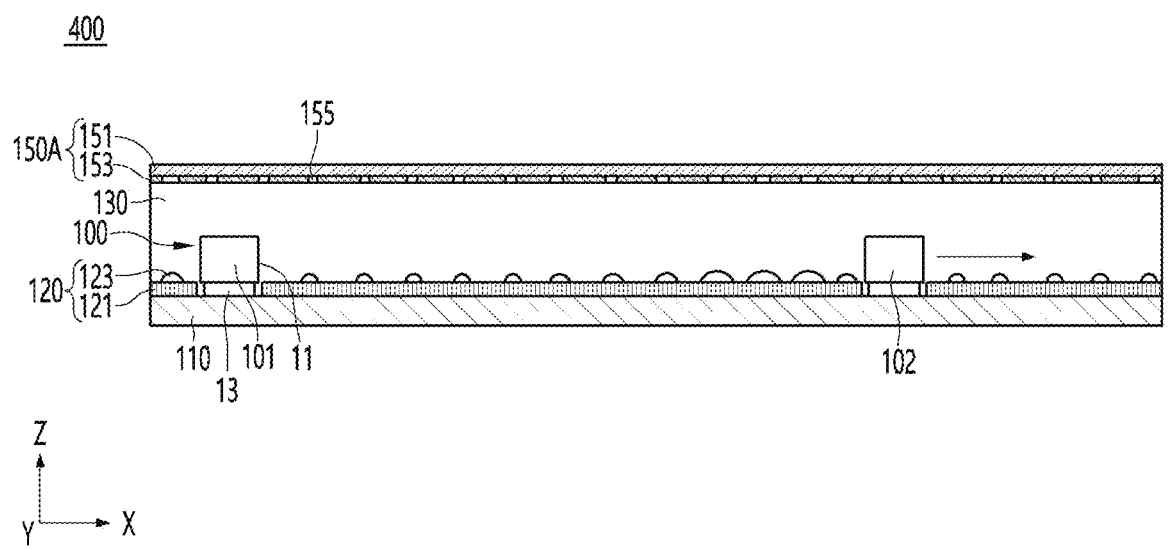
[FIG. 18]
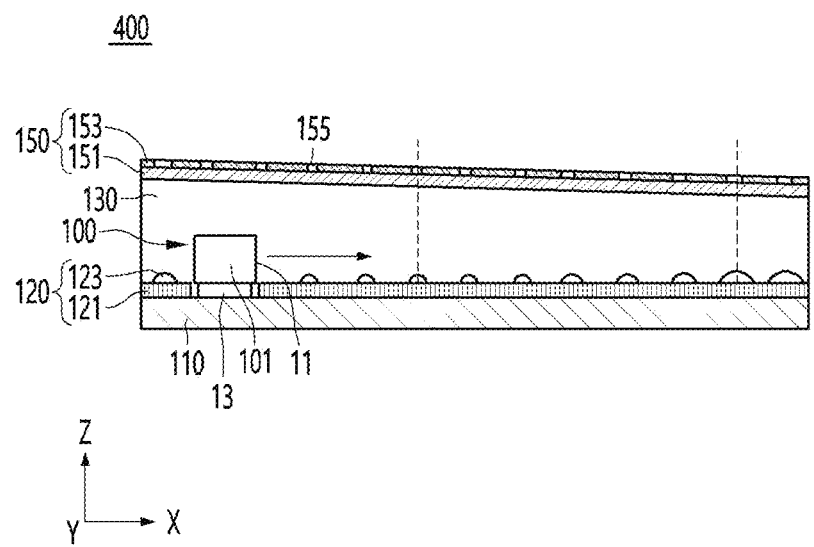

[FIG. 19]
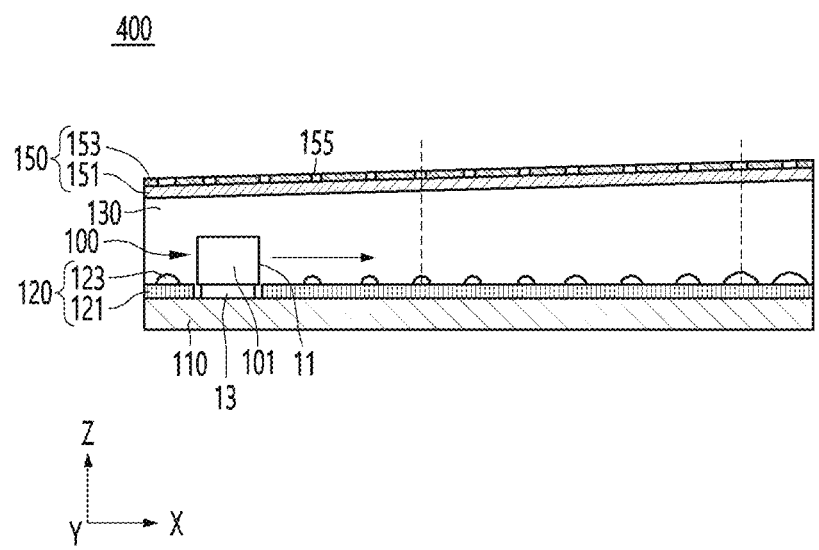
[FIG. 20]
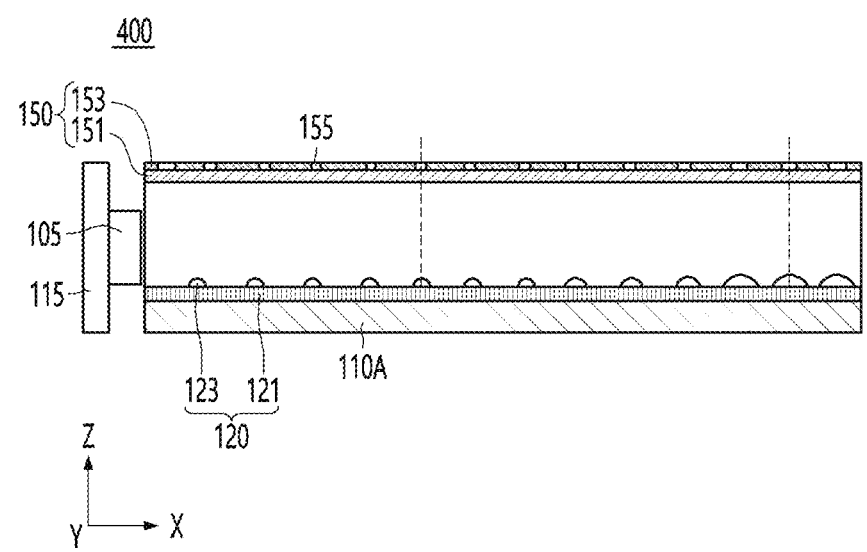

[FIG. 21]
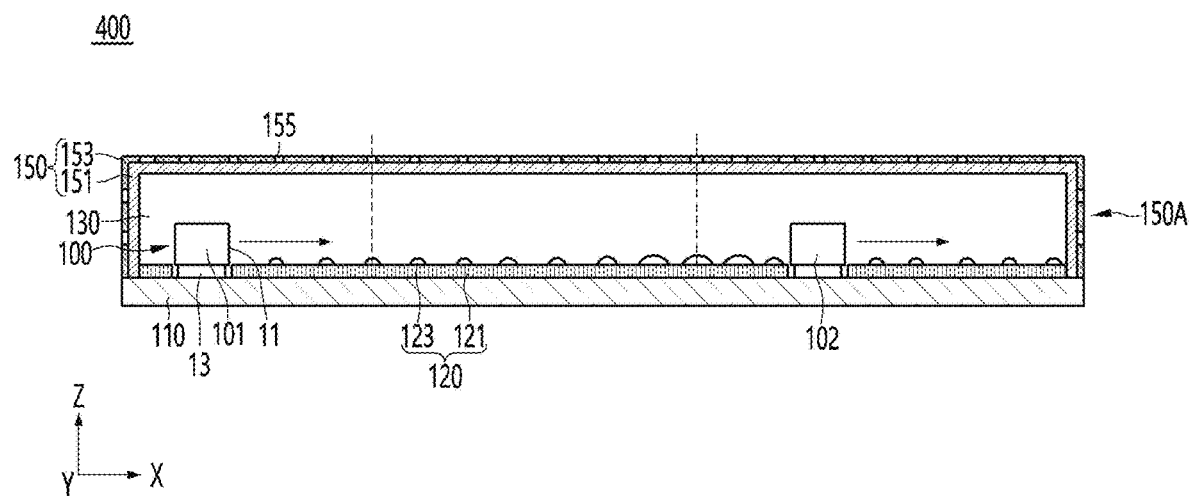
[FIG. 22]
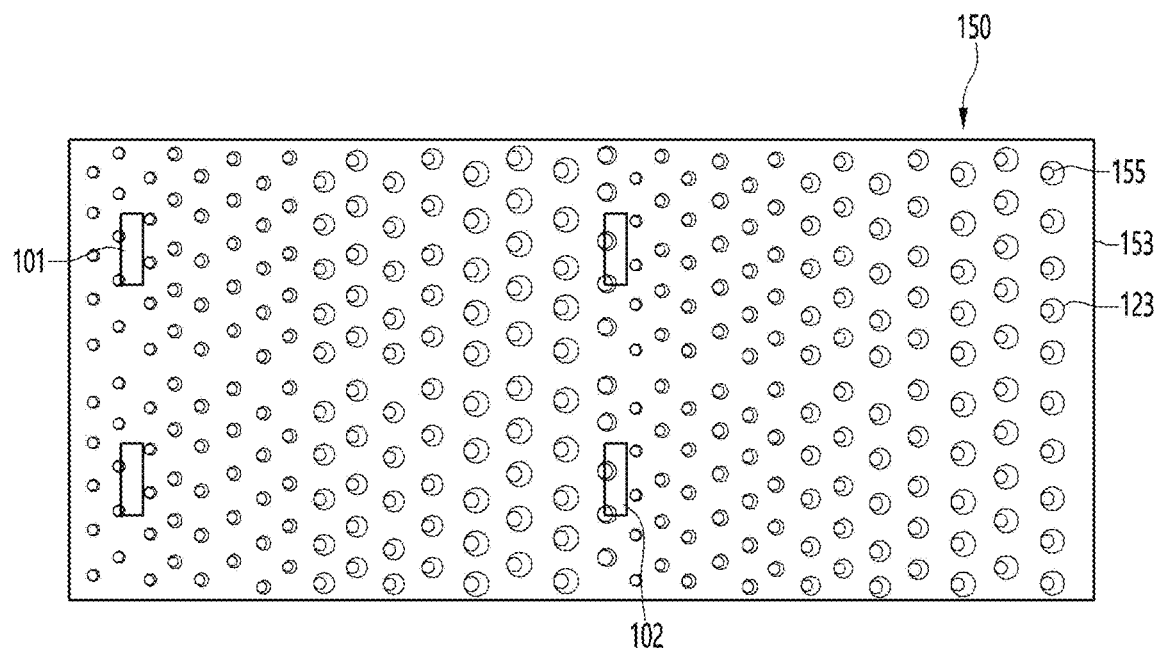

[FIG. 23]
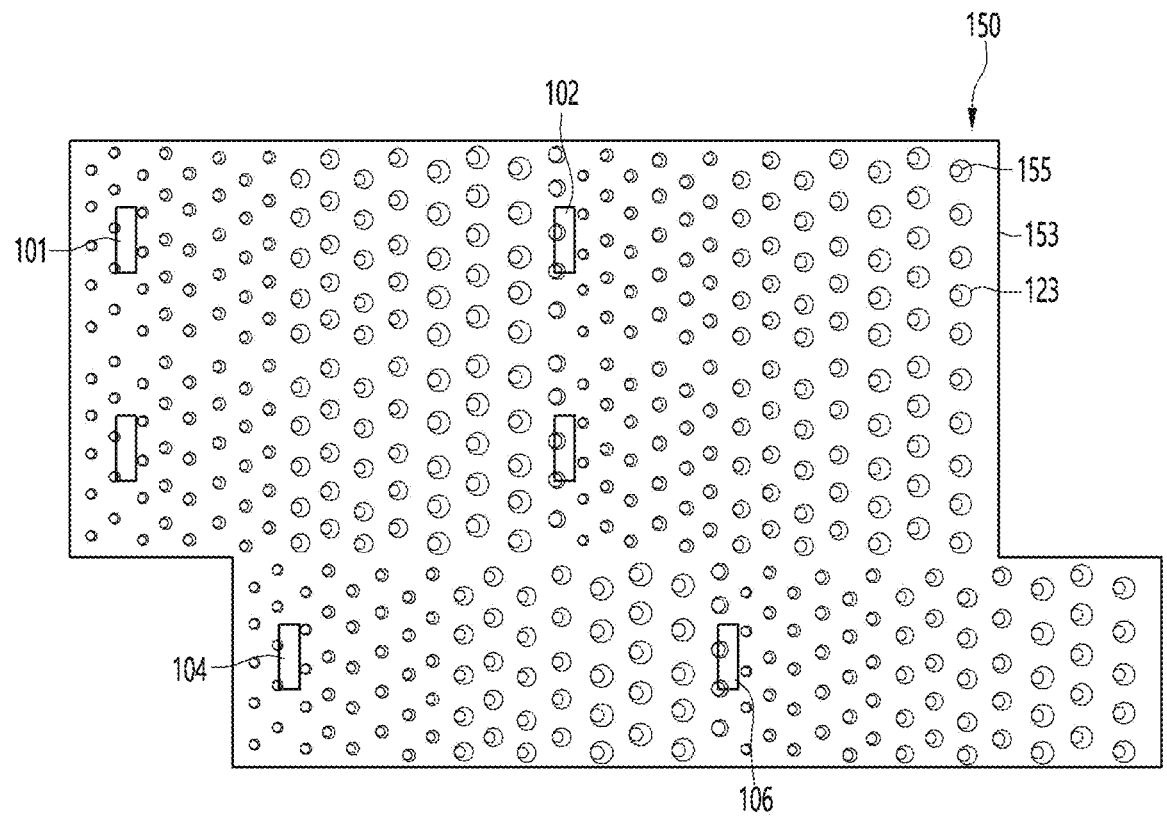
[FIG. 24]
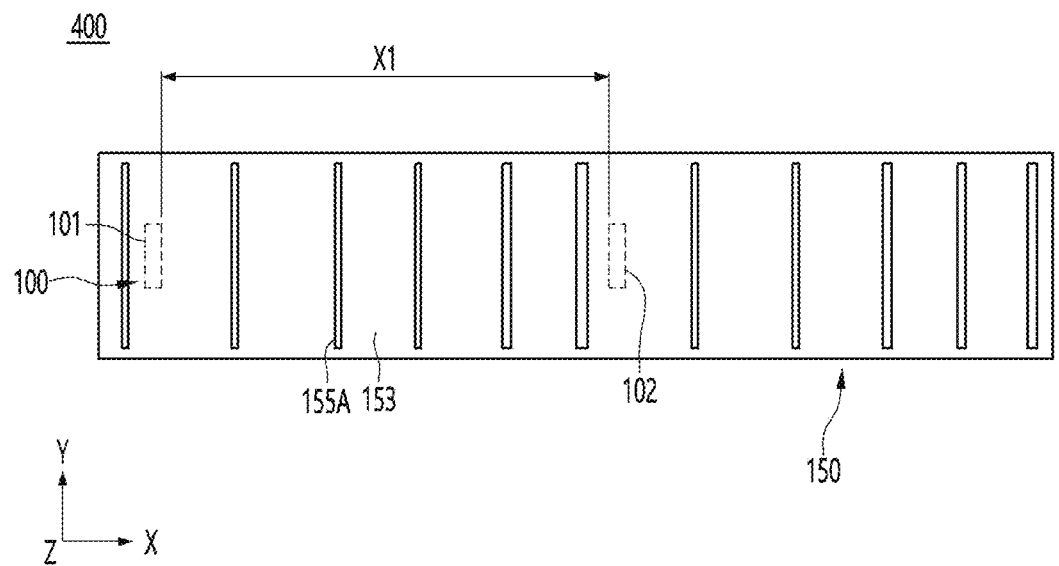

[FIG. 25]
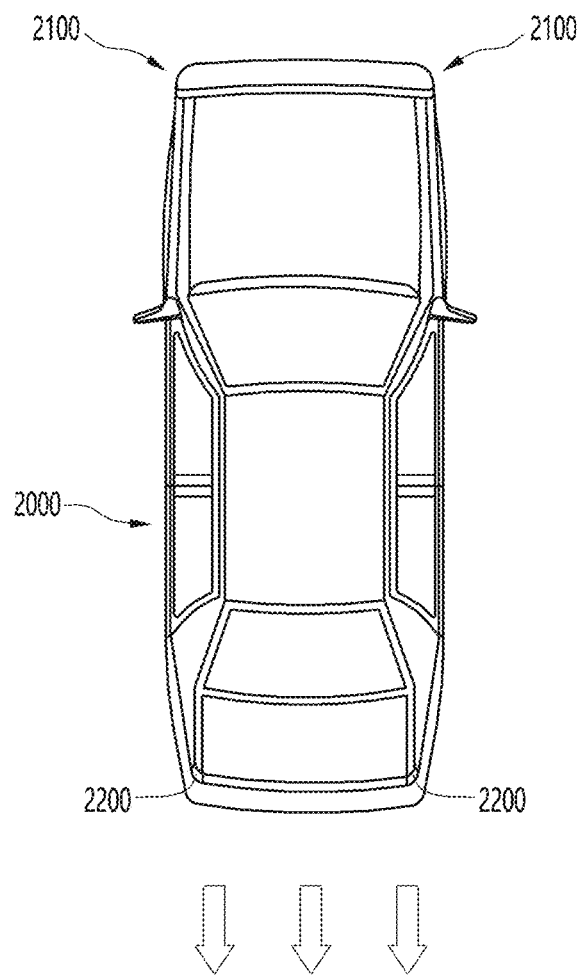

[FIG. 26]
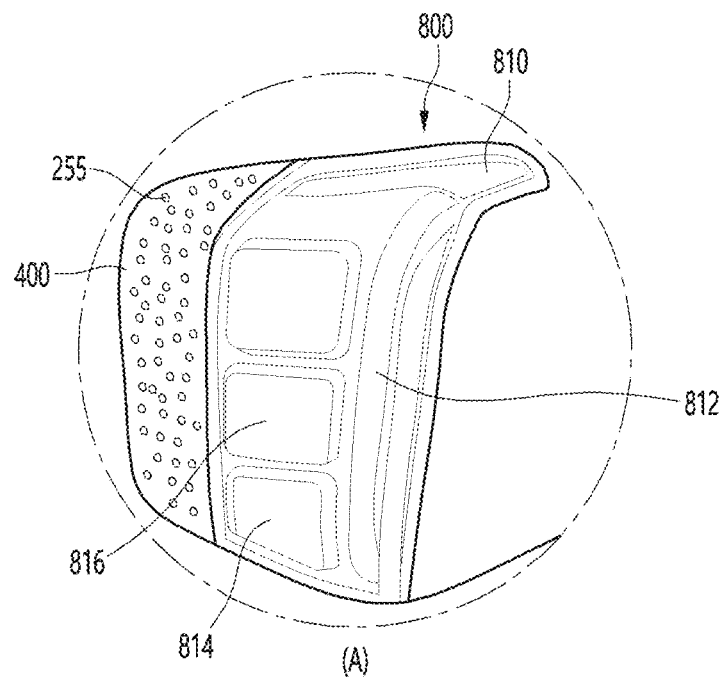
(A)
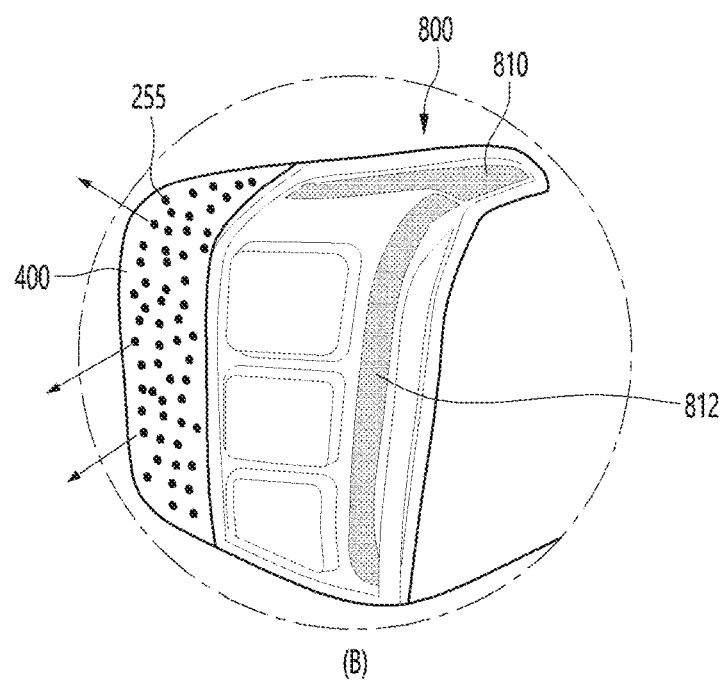
(B)

[FIG. 27]
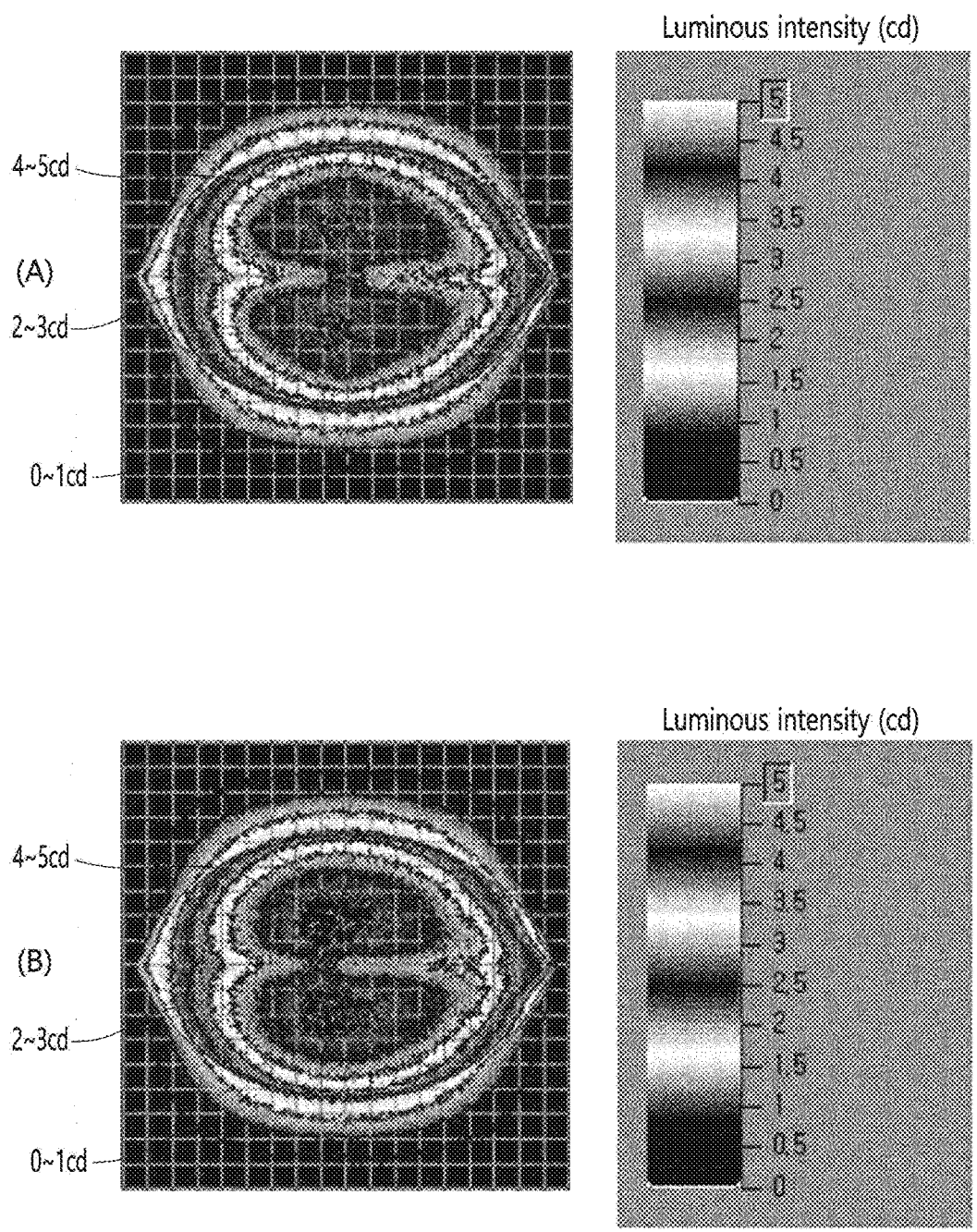

LIGHTING DEVICE AND VEHICLE LAMP HAVING SAME

CROSS-REFERENCE TO RELATED PATENT APPLICATIONS

This application is a U.S. National Stage Application under 35 U.S.C. § 371 of PCT Application No. PCT/KR2022/013860, filed Sep. 16, 2022, which claims priority to Korean Patent Application No. 10-2021-0125300, filed Sep. 17, 2021, whose entire disclosures are hereby incorporated by reference.

TECHNICAL FIELD

An embodiment of the invention relates to lighting devices. An embodiment of the invention relates to a light unit or vehicle lamp having a lighting device.

BACKGROUND ART

Light emitting diode (LED) have advantages such as low power consumption, semi-permanent life, fast response speed, safety, and environmental friendliness compared to conventional light sources such as fluorescent lamps and incandescent lamps. The light emitting diode is applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. In addition, because the light emitting diode is small in size, it can increase the design freedom of the lamp and is economical due to its semi-permanent lifespan.

Disclosure

Technical Problem

An embodiment of the invention may provide a lighting device for improving non-light images. An embodiment of the invention can provide a lighting device with improved light distribution characteristics by providing a reflection pattern at a lower portion of the resin layer and a hole at an upper portion of the resin layer. An embodiment of the invention may provide a slim lighting device with improved surface uniformity.

Technical Solution

A lighting device according to embodiment of the invention comprises a substrate; a first reflective layer disposed on the substrate and having a plurality of reflection patterns; a light source disposed on the substrate; a resin layer disposed on the first reflective layer; and a second reflective layer disposed on the resin layer and having a plurality of holes, wherein an arrangement form of the plurality of holes may be a same as an arrangement form of the plurality of reflection patterns.

According to an embodiment of the invention, the arrangement form of the plurality of holes includes n column, the arrangement form of the plurality of reflection patterns includes m column, and m and n are integers of one or more and may be the same or different from each other.

According to an embodiment of the invention, the plurality of holes includes a first hole and a second hole in a first column among the n columns, and a first hole and a second hole in a second column among the n columns, an interval between the first hole and the second hole in the first column is equal to or smaller than an interval between the first hole in the first column and the first hole in the second column, and the first column may be disposed closer to the emission surface of the light source than the second column.

According to an embodiment of the invention, the first reflective layer includes a first reflective film, the plurality of reflection patterns is disposed on the first reflective film, and the plurality of reflection patterns may be covered with a lower portion of the resin layer.

According to an embodiment of the invention, the second reflective layer includes a transparent film and a second reflective film disposed on the transparent film, and the plurality of holes may be penetrated through the second reflective film.

According to an embodiment of the invention, the plurality of reflection patterns and the plurality of holes overlap in one region in a direction perpendicular to an upper surface of the substrate, and a size of the hole may be smaller than a size of the reflection pattern in the overlapping region.

A lighting device according to an embodiment of the invention includes a substrate; a first reflective layer disposed on the substrate; a light source disposed on the substrate; a resin layer disposed on the first reflective layer; and a second reflective layer disposed on the resin layer and having a plurality of holes, wherein the plurality of holes includes a region in which a number of holes per unit area of the plurality of holes increases as a distance from the light source increases in an emission direction of the light source.

According to an embodiment of the invention, wherein each of the plurality of holes is a same size, wherein each of the plurality of reflection patterns is a same size, and the plurality of reflection patterns may include a region in which a number of reflection patterns per unit area increases as a distance from the light source increases in the emission direction of the light source.

According to an embodiment of the invention, each of the plurality of holes has the same size, and the plurality of reflection patterns may include a region where a size of the reflection pattern increases as the distance from the light source in the emission direction of the light source increases.

A lighting device according to an embodiment of the invention includes a substrate; a first reflective layer disposed on the substrate; a light source disposed on the substrate; a resin layer disposed on the first reflective layer; and a second reflective layer disposed on the resin layer and having a plurality of holes, wherein the plurality of holes may include a region where a size of the hole increases as a distance from the light source in the emission direction of the light source increases.

According to an embodiment of the invention, the plurality of reflection patterns includes regions where the size of the reflection pattern increases as the distance from the light source in the emission direction of the light source increases, and a total area of the plurality of holes may be smaller than a total area of a reflection region of the second reflective layer.

According to an embodiment of the invention, the light source includes a plurality of LEDs, and the plurality of LEDs may be arranged to emit light in a first direction. A number or size of the plurality of holes disposed adjacent to an emission surface of a first LED in the first direction based on an emission surface of one of the plurality of LEDs may be different from a number or size of the plurality of holes disposed adjacent to the emission surface of the second LED in a second direction opposite to the first direction.

A lighting device according to an embodiment of the invention includes a first reflective layer having a reflection pattern; a second reflective layer having a plurality of holes; a resin layer disposed between the first reflective layer and the second reflective layer; and a light source that provides light to the inside or outside of the resin layer, wherein the reflective layer includes a region in which at least one of a size or interval of the holes changes as a distance from the light source in an emission direction of the light source increases, the second reflective layer includes a reflective film having the plurality of holes on the resin layer, the plurality of holes may penetrate from the upper surface of the reflective film toward the resin layer, and at least one or at least one column of the plurality of holes may overlap the reflection pattern in a vertical direction.

According to an embodiment of the invention, the reflective film is made of a metal material, the size of the hole is 20 times or less than a wavelength emitted from the light source, the plurality of holes has an overlap ratio of 50% or more with the plurality of reflection patterns, and at least one of the plurality of holes may have an overlap ratio with a vertically overlapping reflection patterns in a range of 1% to 100%.

Advantageous Effects

An embodiment of the invention may improve an off-light image and may change an image of lighting according to a viewing angle. Additionally, it may satisfy customer needs by providing a lighting image in the form of a hidden lamp of a vehicle. An embodiment of the invention may provide a thin lighting device with improved light distribution characteristics. Additionally, different images may be provided when the lighting is turned on or not. An embodiment of the invention may improve the optical reliability of lighting devices by improving surface uniformity, and may be applied to light units, various display devices, or vehicle lamps having the same.

DESCRIPTION OF DRAWINGS

FIG. 1 is a plan view of a lighting device according to an embodiment of the invention.

FIG. 2 is a cross-sectional view along A-A of the lighting device of FIG. 1.

FIGS. 3 (A) and (B) are plan views of the first and second reflective layers disclosed in FIG. 2.

FIG. 4 is a perspective view showing an arrangement form of the reflection pattern of the first reflective layer and the holes in the second reflective layer of FIG. 3.

FIG. 5 is a first modified example of the lighting device of FIG. 2.

FIG. 6 is a second modified example of the lighting device of FIG. 2.

FIGS. 7 (A) and (B) show different arrangement form of the reflection pattern of the first reflective layer and the holes of the second reflective layer shown in FIG. 2.

FIG. 8 is a perspective view showing a different arrangement form of the reflection pattern of the first reflective layer and the holes of the second reflective layer of FIG. 7.

FIG. 9 is a perspective view showing a different arrangement form of the reflection pattern of the first reflective layer and the holes in the second reflective layer of FIG. 2.

FIGS. 10 to 12 are examples of side cross-sectional views showing a vertical arrangement form of the reflection pattern of the first reflective layer and the holes in the second reflective layer.

FIG. 13 is a diagram showing a different arrangement form of a reflection pattern of the first reflective layer and the holes in the second reflective layer of FIG. 2.

FIG. 14 is an example of a side cross-sectional view of the lighting device having the first and second reflective layers of FIG. 13.

FIG. 15 is a detailed configuration diagram of the first reflective layer of FIG. 14.

FIG. 16 is an example of a side cross-sectional view showing a third modified example of the lighting device of FIG. 1.

FIG. 17 is an example of a side cross-sectional view showing a fourth modified example of the lighting device of FIG. 1.

FIG. 18 is a diagram showing an individual light emitting unit as a fifth modified example of the lighting device of FIG. 1.

FIG. 19 is a diagram showing an individual light emitting unit as a sixth modified example of the lighting device of FIG. 1.

FIG. 20 is a side cross-sectional view showing another example of the lighting device of FIG. 1.

FIG. 21 is a side cross-sectional view showing a seventh modified example of the lighting device of FIG. 1.

FIGS. 22 and 23 are plan views showing the arrangement form of a plurality of LEDs in a lighting device according to an embodiment of the invention.

FIG. 24 is a plan view showing an example of hole deformation in the second reflective layer according to an embodiment of the invention.

FIG. 25 is a plan view of a vehicle having a lighting device according to embodiment(s) of the invention.

FIGS. 26 (A) and (B) are diagrams comparing examples of non-lighting or lighting of a vehicle's tail lamp.

FIGS. 27 (A) and (B) are diagrams comparing the luminous intensity according to the reflection pattern of lighting devices according to an embodiment of the invention.

BEST MODE

Hereinafter, preferred embodiments of the invention will be described in detail with reference to the accompanying drawings. However, a technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

FIG. 1 is a plan view of a lighting device according to an embodiment of the invention, FIG. 2 is a cross-sectional view along A-A of the lighting device of FIG. 1, FIG. 3(A)(B) is plan views of the first and second reflective layers disclosed in FIG. 2, FIG. 4 is a perspective view showing an arrangement form of the reflection pattern of the first reflective layer and the holes in the second reflective layer of FIG. 3, FIG. 5 is a first modified example of the lighting device of FIG. 2, FIG. 6 is a second modified example of the lighting device of FIG. 2, FIG. 7(A)(B) shows different arrangement form of the reflection pattern of the first reflective layer and the holes of the second reflective layer shown in FIG. 2, FIG. 8 is a perspective view showing a different arrangement form of the reflection pattern of the first reflective layer and the holes of the second reflective layer of FIG. 7, FIG. 9 is a perspective view showing a different arrangement form of the reflection pattern of the first reflective layer and the holes in the second reflective layer of FIG. 2, FIGS. 10 to 12 are examples of side cross-sectional views showing a vertical arrangement form of the reflection pattern of the first reflective layer and the holes in the second reflective layer, FIG. 13 is a diagram showing a different arrangement form of a reflection pattern of the first reflective layer and the holes in the second reflective layer of FIG. 2, FIG. 14 is an example of a side cross-sectional view of the lighting device having the first and second reflective layers of FIG. 13, FIG. 15 is a detailed configuration diagram of the first reflective layer of FIG. 14, FIG. 16 is an example of a side cross-sectional view showing a third modified example of the lighting device of FIG. 1, and FIG. 17 is an example of a side cross-sectional view showing a fourth modified example of the lighting device of FIG. 1.

Referring to FIGS. 1 to 17, the lighting device 400 according to an embodiment of the invention may include a substrate 110, a first reflective layer 120 disposed on the substrate 110, a light source 100 on the substrate 110, a resin layer 130 disposed on the first reflective layer 120, and a second reflective layer 150 disposed on the resin layer 130. The lighting device 400 may guide the light emitted from the light source 100 and improve the uniformity of the light emitting surface.

The substrate 110 may function as a base member or support member located below the light source 100 and the resin layer 130. The substrate 110 includes a flexible or rigid substrate (PCB: Printed Circuit Board). The substrate 110 may include, for example, at least one of a resin-based printed circuit board (PCB), a metal core PCB, a flexible PCB, a ceramic PCB, or an FR-4 PCB. The substrate 110 may include, for example, a flexible PCB or a rigid PCB. The upper surface of the substrate 110 has an X-axis-Y axis plane, and a thickness of the substrate 110 may be the height in the Z direction. Here, the X and Y directions may be perpendicular to the Z direction.

The substrate 110 includes a wiring layer (not shown) on the upper portion, and the wiring layer may be electrically connected to the light sources 100. The light sources 100 include a plurality of LEDs 101 and 102, and the plurality of LEDs 101 and 102 may be connected in series, parallel, or series-parallel by a wiring layer of the substrate 110. The light sources 100 may be a group of two or more LEDs connected in series or parallel, or the LED groups may be connected in series or parallel. The thickness of the substrate 110 may be 0.5 mm or less, for example, in the range of 0.3 mm to 0.5 mm. Since the substrate 110 is provided with a thin thickness, the flexible module can be supported without increasing the thickness of the lighting device 400.

The substrate 110 may have a top view shape of a polygon such as a rectangle or square, may include a bridge or finger shape extending in different directions, or may include a bar shape with a curved surface. The substrate 110 may include a protective layer or a reflective layer on the upper portion. The protective layer or reflective layer may include a member made of a solder resist material, and the solder resist material is a white material and may reflect incident light. As another example, the substrate 110 may include a transparent material. Since the substrate 110 is made of a transparent material, light emitted from the light source 100 may be emitted in the upper and lower directions of the substrate 110.

The first reflective layer 120 may be disposed on the upper surface of the substrate 110. The first reflective layer 120 may be disposed between the substrate 110 and the resin layer 130 and may reflect incident light. The first reflective layer 120 may include a single layer or multiple layers. The first reflective layer 120 may include a plurality of reflection patterns 123. The first reflective layer 120 includes a first reflective film 121 attached to the upper surface of the substrate 110, and the plurality of reflection patterns 123 may be disposed on the first reflective film 121.

The first reflective film 121 may include at least one of a reflective material, such as polyester (PET) film, poly methyl methacrylate (PMMA) material, or poly carbonate (PC). The first reflective film 121 may be provided as a film made of a resin material such as silicone or epoxy, and impurities of a reflective material may be added thereto.

The plurality of reflection patterns 123 may be spaced apart from each other. The plurality of reflection patterns 123 may be formed in a dot shape or a hemispherical shape. As an example, the reflection pattern 123 may have a polygonal shape, a circular shape, an elliptical shape, a regular shape, or an irregular shape when viewed in a plan view, and may be formed in two or three dimensions. The plurality of reflection patterns 123 may be formed of metal or non-metallic material. The plurality of reflection patterns 123 may be formed by printing using reflective powder containing at least one of Al, Ag, $SiO_2$, CaO, $Na_2O$, $TiO_2$, and BaO.

The size of the plurality of reflection patterns 123 may be selected from 0.1 mm or more, for example, within the range of 0.1 mm to 0.9 mm. The size of the reflection pattern 123 may be the bottom diameter or the bottom width, and the height of the reflection pattern 123 may be less than or equal to the bottom width. When the size of the reflection pattern 123 is smaller than the above range, reflection efficiency may be reduced, and when the size of the reflection pattern 123 is larger than the above range, light uniformity within the resin layer 130 may be reduced.

The light source 100 may be disposed in plural numbers on the substrate 110, and the light source 100 includes a plurality of LEDs 101 and 102, and the plurality of LEDs 101 and 102 may be arranged in one or more rows or/and one or more columns. The light source 100 may be arranged in n rows or/and m columns (n, m=1 or more). As shown in FIG. 22, a light source having two rows and two or more columns of LEDs 101 and 102 may be arranged, and as shown in FIG. 23, LEDs 101, 102, 104, and 106 arranged in different lines may be arranged, and the substrate and the upper region thereof may include a region in which a part thereof protrudes in any one direction, or any one region may include a concave region. The light source 100 may include a plurality of LEDs 101 and 102, including a first LED 101 adjacent to one side of the substrate 110 and a second LED 102 adjacent to the other side of the substrate 110. The light source 100 may emit light in a first direction X or may emit light in different directions on the substrate 110.

Light emitted from the light source 100 may be emitted through the resin layer 130. The light source 100 may emit light through at least one side. That is, the light source 100 includes at least one emission surface 11, and the emission surface 11 may be arranged perpendicular to the upper surface of the substrate 110 and may face at least one side surface of the resin layer 130. The light source 100 may emit at least one of white, blue, red, green, ultraviolet (UV), or infrared light. The light source 100 may emit at least one of, for example, blue, red, and green. For example, the LEDs 101 and 102 may be a side-type package. As another example, the light source 100 may be implemented as an LED chip.

The light source 100 may be disposed on the substrate 110 and sealed by the resin layer 130. The plurality of light sources 100 may be in contact with the resin layer 130. The resin layer 130 may be disposed on the side surfaces and upper surface of the light source 100. The resin layer 130 seals the light sources 100 and may be in contact with the upper surface of the substrate 110 and/or the first reflective layer 120. The lower portion of the light source 100 may be disposed on the substrate 110 through a coupling hole in the first reflective layer 120 and may be bonded to the substrate 110 and the bonding member 13.

The resin layer 130 is disposed on the substrate 110 and seals the light source 100. The resin layer 130 may be made of a transparent resin material, such as UV (Ultraviolet) resin, silicone, epoxy, or PET (polyethylene terephthalate). The resin layer 130 may be a transparent material layer to which no impurities are added. When the resin layer 130 is free of impurities, light may be transmitted with high linearity. As another example, the resin layer 130 may include a diffusion agent therein.

The resin layer 130 may be thicker than the thickness of the light source 100. The thickness of the resin layer 130 may be thicker than the thickness of the substrate 110. The thickness of the resin layer 130 may be at least 5 times thicker than the thickness of the substrate 110, for example, in the range of 5 to 9 times. By being disposed with the above thickness, the resin layer 130 may seal the light source 100 on the substrate 110, prevent moisture from penetrating, and support the substrate 110. The resin layer 130 and the substrate 110 may function as flexible plate. The thickness of the resin layer 130 may be 2.7 mm or less, for example, in the range of 2 mm to 2.7 mm. When the thickness of the resin layer 130 is less than the above range, the diffusion distance of light may increase, and when it is greater than the above range, the overall thickness may increase or the luminous intensity may decrease.

The second reflective layer 150 includes a plurality of holes 155, and each of the plurality of holes 155 may be a transmission hole having a circular shape and transmits light incident through the resin layer 130. The second reflective layer 150 may emit surface light from the resin layer 130 as dot light. As shown in FIG. 22, when each of the plurality of holes 155 has a straight shape, it may emit light as straight light, and when each of the plurality of holes 155 has a curved shape, it may emit light as curved light. Accordingly, each of the holes 155 may include a circular shape, an oval shape, a straight shape, a curved shape, a mixture of at least two of these, or a shape of two or more of these connected to each other.

The second reflective layer 150 may include a second reflective film 153 having a plurality of holes 155. The second reflective layer 150 may include a transparent film 151 and a second reflective film 153 disposed on the transparent film 151. The transparent film 151 includes a transparent resin material, and may include, for example, at least one of polyester (PET), poly methyl methacrylate (PMMA), or poly carbonate (PC). The transparent film 151 may be placed on or spaced apart from the upper surface of the resin layer 130. The transparent film 151 may be adhered to the upper surface of the resin layer 130 with an adhesive material such as silicone or epoxy.

The second reflective film 153 includes a metal film and may include at least one of Al, Ag, and Pt, and may be laminated as an Al layer on the transparent film 151, for example. At this time, when the Al layer is exposed on the second reflective layer 150, when the light is not turned on, the Al surface may be exposed, and light may be emitted through the holes 155 when turned on. The holes 155 may have a size that is not visible from the outside when not turned on.

The second reflective film 153 is disposed on the upper surface of the transparent film 151 to reflect light incident through the transparent film 151 and transmit it through the plurality of holes 155. Each of the plurality of holes 155 may penetrate from the upper surface to the lower surface of the second reflective film 153. Each of the plurality of holes 155 may not penetrate to the upper or lower surface of the transparent film 151. That is, the second reflective layer 150 may be formed by punching a plurality of holes 155 on the second reflective film 153 through a laser process and then coating or depositing on one side of the transparent film 151.

The second reflective film 153 may be disposed on one side or both sides of the transparent film 151. The second reflective layer 150 including the second reflective film 153 and the transparent film 151 may be attached to the surface of the resin layer 130. At this time, the second reflective film 153 may be disposed on the outer layer of the transparent film 151. As another example, the second reflective film 153 may be an inner layer of the transparent film 151, or may be implemented as an outer layer and an inner layer.

The thickness of the second reflective layer 150 may be 0.6 mm or less, for example, in a range from 0.1 mm to 0.6 mm. when the thickness is smaller than the above range, workability may not be easy or surface uniformity may be reduced, and when the thickness is thicker than the above range, the thickness of the lighting device 400 increases, and ductility characteristics may deteriorate.

The thickness of the transparent film 151 may be 0.3 mm or less, for example, in the range of 0.05 mm to 0.3 mm. When it is thinner than the above range, it is difficult to function as a base layer in process measurement, and when it is thicker than the above range, it is difficult to implement ductility characteristics. The thickness of the second reflective film 153 may be 0.3 mm or less, for example, in the range of 0.05 mm to 0.3 mm. when it is thinner than the above range, reflective characteristics may deteriorate, and when it is thicker than the above range, laser processing may be difficult. The second reflective film 153 may be thinner or the same as the thickness of the transparent film 151. The thickness of the second reflective film 153 may be the same as the depth of the hole 155.

Each of the plurality of holes 155 may have the same upper and lower diameters. The plurality of holes 155 may have a diameter or width of 90 μm or less, for example, in the range of 10 μm to 90 μm or 30 μm to 70 μm. The size of the hole 155 may be 20 times or less, for example, 2 to 15 times the wavelength (e.g., red wavelength) emitted from the light source 100. When the diameter or width of the hole 155 is smaller than the above range, processing is difficult, and when it is larger than the above range, the hidden characteristics of the holes may be difficult. As another example, at least one or two of the plurality of holes 155 may have a lower diameter smaller than the upper diameter, and may be irradiated with a wider light distribution through the inclined surface of the holes 155.

Each of the plurality of holes 155 may have the same upper surface area and lower surface area. As another example, the upper surface area of each of the holes 155 may be larger than the lower surface area, and in this case, the upper surface area to which the laser is irradiated may be larger than the lower surface area. The size of the hole 155 may be 90% or less of the size of the reflection pattern 123, for example, in the range of 10% to 90%. The upper or lower surface area of the hole 155 may be 90% or less of the lower surface area of the reflection pattern 123, for example, in the range of 10% to 90%. The size of the hole 155 may be the width of each hole 155 or may include the area of the upper or lower surface. When the size of the hole 155 is smaller than the above range, processing is difficult, and when the size of the hole 155 is larger than the above range, the holes may be visible from the outside or surface uniformity may deteriorate.

As shown in FIG. 3, when the plurality of holes 155 are arranged in n rows and m columns (m, n are integers of 2 or more), the holes 155 may include a region in which an interval D1 between adjacent columns (e.g., L1 and L2) is greater than or equal to the interval D2 between the holes 155 in each of the columns L1 and L2. Here, the interval D2 between each hole 155 may be 0.5 mm or more, for example, in the range of 0.5 mm to 2 mm, and the interval D1 between the adjacent columns L1 and L2 may be 0.5 mm or more, for example, in a range of 0.5 mm to 2 mm. The intervals D1 and D2 may be the same or decrease as the distance from the LEDs 101 and 102 increases. Preferably, the plurality of holes 155 include the first hole and the second hole in the first columns L1 among the n columns, and the first hole and the second hole in the second column L2 among the n columns, and the interval D2 between the first hole and the second hole in the first column L1 may be equal to or less than the interval D3 between the first hole and the second hole in the second column L2. The first column L1 may be disposed closer to the emission surface 11 of the light source 100 than the second column L2.

The holes 155 according to the first example may include regions where the holes 155 have the same size or/and regions where the size of the holes 155 gradually increases as the distance from the light source 100 (101, 102) increases. Here, the region where the holes 155 are the same size may include at least two columns, and the regions in which the size of the holes 155 gradually increases may include a region in which the size of the holes 155 continuously increases in the first direction X or discontinuously increases in the first direction X. Additionally, the increasing region may include at least two regions of the same size within each region and different sizes in adjacent regions. Here, the continuously increasing region may gradually increase as the distance from the emission surface 11 of the LEDs 101 and 102 increases, and may be the same in each column, or may increase as the distance from the emission surface 11 of the LEDs 101 and 102 increases.

The holes 155 according to the second example may include regions where the distance between the holes 155 is the same or/and regions where the distance between the holes 155 gradually increases as the distance from the light source 100 (101, 102) increases. Here, the region where the interval between the holes 155 is the same may include at least two columns, and the region in which the interval of the holes 155 gradually increases may include a region in which the interval of the holes 155 increases continuously in one direction (e.g., emission direction) or discontinuously in one direction. Also, the increasing region may have the same or different intervals within each region or each column.

As in the example of FIG. 4, the region where the reflection patterns 123 are arranged may include a first region A1 in which a first reflection pattern R1 having a first size is arranged, a second region A2 in which a second reflection pattern R2 having a second size larger than the first size is arranged, and a third region A3 in which a third reflection pattern R3 having a third size larger than the second size is arranged. The first region A1 has the first reflection patterns R1 arranged in two or more columns based on the emission surfaces 11 of the LEDs 101 and 102, and the second region A2 is disposed between the first region A1 and the third region A3 and has the second reflection pattern R2 arranged in two or more columns, and the third region A3 is disposed in the farthest region based on the emission surface 11 of the LEDs 101 and 102, and the third reflection patterns R3 may be arranged in two or more columns. The first to third regions A1, A2, and A3 are regions where the size of the reflection pattern 123 discontinuously increases.

The region in which the holes 155 are arranged is described as first to third regions A1, A2, and A3 so as to correspond to the regions of the first to third reflection patterns R1, R2, and R3, The region in which the holes 155 are arranged may include a first region A1 in which first holes H1 of a fifth size are arranged, a second region A2 in which second holes H2 of a sixth size larger than the fifth size are arranged, and a third region A3 in which third holes H3 of a seventh size larger than the sixth size are arranged. The first holes H1 are arranged in two or more columns in the first region A1 with respect to the emission surface 11 of the LEDs 101 and 102, and the second holes H2 are arranged in two or more columns in the second region A2 between the first region A1 and the third region A3, and the third hole H3 of the third region A3 is arranged in two or more columns in the farthest region with respect to the emission surface 11 of the LEDs 101 and 102. The first to third regions A1, A2, and A3 are regions in which the sizes of the holes H1, H2, and H3 are discontinuously increased.

As shown in FIGS. 1 and 4, when the sizes of the holes H, H2, and H3 are SA1, SA2, and SA3, the first to third regions A1, A2, and A3 according to the first example may have a relationship of HA1<HA2<HA3. When the sizes of the reflection patterns R1, R2, and R3 are RA1, RA2, and RA3, the first to third regions A1, A2, and A3 may satisfy a relationship of RA1<RA2<RA3. The total area of the holes in the second reflective layer 150 may be smaller than the upper surface area of the reflective layer excluding the holes. The total area of the reflection patterns in the first reflective layer 120 may be smaller than the upper surface area of the reflective layer excluding the reflection patterns.

As an example, the lighting device 400 may include a fourth region A4. The fourth region A4 is a region at a predetermined distance in the rear direction from the emission surface 11 of each LED 101 and 102, and may be disposed between the third region A3 and the first region A1 adjacent to the second LED 102, or may be disposed in a rear region from the emission surface 11 of the second LED 102. In the fourth region A4, the size of the fourth reflection pattern R4 may be the same as the size of the first or second reflection patterns R1 and R2 in the first and second regions A1 and A2, or may be smaller than the size of the third reflection pattern R3 in the third region A3. In the fourth region A4, the size of the fourth hole H4 may be the same as the size of the first or second holes H1 and H2 in the first and second regions A1 and A2, or may be smaller than the size of the third hole H3 in the third region A3.

At least two of the n columns of holes 155 (e.g., L1, L2) may be parallel to each other, or may be arranged parallel or inclined to a straight line parallel to each emission surface 11 of the LEDs 101 and 102. The n columns may be arranged in a concentric shape with respect to the LEDs 101 and 102.

As shown in FIGS. 3 and 4, in the embodiment of the invention, the first reflection pattern R1 of the minimum size among the plurality of reflection patterns 123 may be greater or equal to the third hole R3 of the maximum size among the plurality of holes 155. That is, since each of the plurality of holes 155 is processed using a laser, more than 95% of the holes 155 may be provided in a size smaller than the minimum size of the reflection pattern 123.

Among the plurality of holes 155, at least one, at least one column, or two or more may overlap the reflection pattern 123 in a direction Z perpendicular to the substrate 110. The plurality of holes 155 and the plurality of reflection patterns 123 may overlap in a direction perpendicular to the substrate 110 in some regions Z1 and Z2. The overlap ratio of the plurality of holes 155 and the plurality of reflection patterns 123 may overlap by more than 50%, for example, in the range of 60% to 98% or 80% to 98%, in the direction perpendicular to the substrate 110. When the overlap ratio is within the above range, light distribution may be improved, and when it is outside the above range, a region where a hot spot is generated may be created. In the plurality of holes 155, the ratio or number of holes that overlap the reflection pattern 123 in a vertical direction may be greater than the ratio or number of holes that do not overlap the reflection pattern 123. Additionally, the total number of the plurality of holes 155 may be greater than the total number of the plurality of reflection patterns 123.

As an example of the invention, the plurality of reflection patterns 123 may overlap each of the holes 155 in a vertical direction. That is, the plurality of reflection patterns 123 may be disposed in regions Z1 and Z2 that face the holes 155 one-to-one. Since the size of each of the holes 155 is smaller than the size of each of the reflection patterns 123, the vertically overlapping holes 155 may overlap with the center or edge portion of the reflection pattern 123. For example, as shown in FIG. 4, when looking at the view of the first reflective layer 120 from the second reflective layer 150, the overlapping holes 155 may be located in a region closer to the LEDs 101 and 102 among regions of the reflection pattern 123. As another example, the overlapping holes 155 may be located in a region of the reflection pattern 123 that is farther from the LEDs 101 and 102. Accordingly, light reflected from the reflection pattern 123 having a curved surface may proceed to opposing holes 155. That is, the holes 155 may be disposed according to at least one or two or more of a center region, an inner edge of the center, or an outer edge of the center based on the center of the reflection pattern 123 according to a direction in which light is reflected or refracted.

Among the holes 155, fourth holes H4 overlapping with the first and second LEDs 101 and 102 may be disposed in the fourth region A4. The overlap ratio between the fourth holes H4 and the fourth reflection pattern R4 in the fourth region A4 may be lower than the overlap ratio of the second and third regions A2 and A3. Here, within the entire region, at least one hole 155 may overlap with the reflection pattern 123 below it at an overlap ratio of 1% to 100%. When the overlap ratio is outside the above range, dark portion may occur in some regions or light distribution may not be uniform.

As an example of the invention, the arrangement form of the plurality of reflection patterns 123 may be the same as or partially include the same region as the arrangement form of the holes 155. That is, the distance between the centers of adjacent reflection patterns 123 based on the emission surfaces 11 of the LEDs 101 and 102 may be equal to or partially include the same region as the distance between the centers of adjacent holes 155. For example, at least one column of the plurality of reflection patterns 123 may have the same arrangement form as at least one column of the holes 155 and may overlap in the vertical direction. Alternatively, when the arrangement form of the plurality of holes 155 includes n columns and the arrangement form of the plurality of reflection patterns 123 includes m columns, m and n are integers of 1 or more and may be the same or different form each other.

Accordingly, since the plurality of reflection patterns 123 face the holes 155 on a one-to-one basis, light emitted from the LEDs 101 and 102 and light reflected by the reflection pattern 123 may be emitted directly or indirectly through the holes 155. Accordingly, light uniformity of the second reflective layer 150 may be improved. The lighting device 400 has a distribution of lights emitted through the hole 155 when turned on, and when not turned on, the reflective material (e.g., Al), which is the surface color of the second reflective layer 150, may be exposed or visible. When not turned on, the hole size may be small and may not be visually recognized from the outside, that is, at a distance of 30 cm or more. In this embodiment, the light distribution at the time of lighting is provided as in FIG. 27(A), and the front light distribution is 4.5 cd, which satisfies the front light distribution law of the vehicle.

As shown in FIG. 5, the lighting device 400 may include a fifth region A5. The fifth region A5 is disposed on an upper portion of the first and second LEDs 101 and 102, and may be a region without the holes 155 and covered with the reflective film 153. The fifth region A5 may be a light blocking region. That is, by arranging a light blocking region on the first and second LEDs 101 and 102, it is possible to block light of relatively high intensity from being emitted in front of the LEDs 101 and 102. The light blocking region may have an emission side area larger than a rear side area based on the LEDs 101 and 102. The light blocking region may have a hemispherical shape or a circular shape.

As shown in FIG. 6, the LEDs 101 and 103 disposed on opposite sides of the substrate 110 may have their emission surfaces 11 facing toward the center of the lighting device 400. The two LEDs 101 and 103 arranged on opposite sides may be arranged to face each other on the same line, or may be arranged to be offset from each other. Accordingly, the LEDs 101 and 103 may radiate light toward the center region. The configuration of the first and second reflective layers 120 and 150 may selectively apply the examples arranged on the emission side of the light source 100 disclosed above. For example, as the distance from the emission surface 11 of the first and second LEDs 101 and 103 increases, the size of the reflection patterns 123 may gradually increase, and at least one hole 155 of the second reflection layer 150 may face an upper portion of each of the reflection patterns 123.

Among the plurality of LEDs 101 and 102, the number or size of the plurality of holes 155 disposed adjacent to the exit surface 11 of the first LED 101 in the first direction X may be the same as or different from the number or size of the plurality of holes 155 disposed adjacent to the emission surface 11 of the second LED 103 in a direction opposite to the first direction X.

FIGS. 7, 8, and 9 are examples of modified holes 155 of the second reflective layer 150 in the configuration disclosed above, and the size of the holes 155 may be provided the same in all regions. As shown in FIGS. 7 to 9, the unit density of the first hole H1 in the first region A1 may be smaller than the unit density of the second hole H2 in the second region A2, the unit density of the second holes H2 in the second region A2 may be smaller than the unit density of the third holes H3 in the third region A3. The first to third holes H1, H2, and H3 may be disposed in a larger number as they move away from each of the LEDs 101 and 102, or an interval between the holes may become narrower as the regions A1, A2, and A3 are farther away. The fourth region A4 may be arranged in any one of the first and second holes H1 and H2 or arranged at intervals.

As shown in FIG. 8, in the first region A1 or a part thereof, the first hole H1 and the first reflection pattern R1 may overlap one to one in the vertical direction, and in the second region A2 or a part thereof, one or two second holes H2 may overlap each of the second reflection patterns R2 in a vertical direction, and in the third region A3 or a part thereof, one, two, three or four third holes H3 may overlap each of the third reflection patterns R3 in a vertical direction.

As shown in FIG. 9, when the sizes of the holes 155 in the second reflective layer 150 are the same in the entire region, and the size of the reflection pattern 123 disposed under the second reflective layer 123 is the same in the entire region and is larger than the size of the hole 155, 50% or more or 70% or more of the holes 155 may face each of the reflection patterns 123 on a one-to-one basis.

The fourth region A4 shown in FIGS. 4 and 7 to 9 may be removed, in which case the third hole H3 and the third reflection pattern R3 of the third region A3 may extend to the rear side of each of the LEDs 101 and 102. In addition, in the first, second, and third regions A1, A2, and A3, the first hole H1 may be defined as a first hole group, the second hole H2 may be defined as a second hole group, and the third hole H3 may be defined as a third hole group. Also, in the first, second, and third regions A1, A2, and A3, the first reflection pattern R1 may be defined as a first reflection pattern group, the second reflection pattern R2 may be defined as a second reflection pattern group, and the third reflection pattern R3 may be defined as a third reflection pattern group. In addition, each of the holes H1, H2, H3, and H4 may be defined as a unit hole, and each of the reflection patterns R1, R2, R3, and R4 may be defined as a unit reflection pattern.

FIGS. 10 to 12 illustrate the arrangement form of the reflection pattern and the arrangement form of the holes above the reflection pattern disclosed in an embodiment of the invention.

Referring to FIGS. 10 and 3, the plurality of first reflection patterns R11 or the first group may have a first width w1, and the plurality of first reflection patterns R11 adjacent to each other on the first column L1 (see FIG. 3) may be spaced apart at a first interval. The first interval between the plurality of first reflection patterns R11 adjacent to each other along the column of the first reflection patterns R11 may be equal to each other. Here, the first column L1 of the first reflection patterns R11 is shown as a straight line, but may have a curved or diagonal shape.

The second reflection pattern R12 or the second group may be located at a greater distance from the light source 100 than the first reflection pattern R11. The second interval between the plurality of second reflection patterns R12 adjacent to each other along the column of the second reflection patterns R12 may be equal to each other. Here, the column of the second reflection pattern R12 are shown as straight lines, but may have a curved or diagonal shape.

The third reflection pattern R13 or the third group may be located at a greater distance from the light source 100 than the second reflection pattern R12. The third interval between the plurality of third reflection patterns R13 adjacent to each other along the row of the third reflection patterns R13 may be equal to each other. Here, the column of the third reflection pattern R13 are shown as straight lines, but may have a curved or diagonal shape.

The fourth reflection pattern R14 or the fourth group may be located at a greater distance from the light source 100 than the third reflection pattern R13. The fourth interval between the plurality of fourth reflection patterns R14 adjacent to each other along the column of the fourth reflection patterns R14 may be equal to each other. Here, the column of the fourth reflection pattern R14 are shown as straight lines, but may have a curved or diagonal shape.

As shown in FIGS. 10 and 11, when the widths of each of the first to fourth reflection patterns R11, R12, R13, and R14 are W1, W2, W3, and W4, with respect to the light source 100, a region satisfying at least one condition of the relationship of W1<W2, W2<W3, W3<W4, W1<W2<W3, or W1<W2<W3<W4 may be included. As shown in FIGS. 10 and 12, when the intervals between the first to fourth reflection patterns R11, R12, R13, and R14 are P1, P2, and P3 with respect to the light source 100, a region satisfying at least one of the conditions of P1>P2, P2>P3, or P1>P2>P3 may be included. As shown in FIG. 11, when the widths of each of the first to fourth reflection patterns R11, R12, R13, and R14 are W1, W2, W3, and W4, with respect to the light source 100, a region satisfying at least one of the relationships of W1<W2, W2<W3, W3<W4, W1<W2<W3, or W1<W2<W3<W4 and when the intervals between the adjacent first to fourth reflection patterns R11, R12, R13, and R14 are P1, P2, and P3, a region satisfying at least one of the conditions of P1=P2, P2=P3, or P1=P2=P3 may be included.

As shown in FIG. 12, when the widths of each of the first to fourth reflection patterns R11, R12, R13, and R14 are W1, W2, W3, and W4, based on the light source 100, a region satisfying at least one of the conditions of W1=W2, W2=W3, W3=W4, W1=W2=W3, or W1=W2=W3=W4 may include, and when the intervals between the first to fourth reflection patterns R11, R12, R13, and R14 are P1, P2, and P3, a region satisfying at least one of the conditions of P1>P2, P2>P3, or P1>P2>P3 may include.

At least a portion of each of the first to fourth holes H11, H12, H13, and H14 may be arranged to overlap in the vertical direction on an upper portion of each of the first to fourth reflection patterns R11, R12, R13, and R14. Accordingly, the first to fourth holes H11, H12, H13, and H14 have a width smaller than the width W1, W2, W3, and W4 of the reflection patterns R11, R12, R13, and R14, and have the same width (See FIG. 12) or may face each other with a width (See FIGS. 10 and 11) that becomes larger as the distance from the light source 100 increases.

As shown in FIGS. 13 to 15, the first reflective layer 120 may include a polygonal reflection pattern 123 on the first reflective film 121. The reflection pattern 123 may be spaced apart from the periphery of the emission side of the LEDs 101 and 102, and may gradually become larger as it moves away from each LED 101 and 102, or may be provided in the same size. Here, the minimum separation distance D5 between the reflection pattern 123 and the emission side of the LEDs 101 and 102 is spaced apart in a range of 10% or more, for example, in the range of 10% to 50% or 20% to 40% of the distance X1 between the LEDs 101 and 102. The minimum separation distance D5 may be spaced so that hot spots are suppressed or the light distribution is 90% or more uniform through the second reflective layer 150 due to the reflection pattern 123.

The first reflective layer 120 may include, for example, a base reflective layer 122, a light transmitting layer 124 disposed on the base reflective layer 122, and a pattern layer 126 disposed between the base reflective layer 122 and the light transmitting layer 124. The base reflective layer 122 includes a material that reflects light, such as a metal or non-metallic material. When it is a metal, a metal layer such as Ag may be disposed, and when it is a non-metallic material, it may include a plastic material. The light transmitting layer 124 is a transparent film and may include at least one of a resin material such as silicone or epoxy, or a transparent plastic material such as polyethylene terephthalate (PET), polyvinyl chloride (PVC), or urethane.

The pattern layer 126 may adhere between the base reflective layer 122 and the light transmitting layer 124 and may include a plurality of reflection patterns R5 therein. The pattern layer 126 may include a metal oxide, for example, $TiO_2$, $CaCO_3$, $BaSO_4$, $Al_2O_3$, or may be printed using an ink containing at least one of silicon and polysilicon (PS). The pattern layer 126 may be formed of, for example, a material in which a metal oxide is added to silicon or epoxy.

The density of the reflection pattern R5 may gradually increase as the distance from the light source 100 increases. The unit structure of the reflection pattern R5 may have a polygonal shape, a circular shape, an elliptical shape, a regular shape, or an irregular shape, and may be formed in two or three dimensions. The unit structure of the reflection pattern R5 may be formed in a densely packed hexagonal shape with an air gap therein. By reflecting light by the pattern layer 126 and the base reflective layer 122, the number of light sources 100 may be reduced and light uniformity in the entire region may be improved. Since the first reflective layer 120 is disposed on the bottom of the resin layer 130, the thickness of the resin layer 130 may be reduced.

As shown in FIG. 13, the size of the plurality of reflection patterns R5 can become larger as the distance from the LEDs 101 and 102 increases, and the arrangement form of the holes 155 may include a region that increases as the distance from the emission side of the LEDs 101 and 102 increases or/and a region where the density of unit hole increases. As shown in FIG. 14, the lighting device may include a region where at least one or a plurality of holes 155 overlap in the vertical direction on a plurality of reflection patterns R5.

In the lighting device according to the embodiment of FIGS. 13 to 15, some holes (holes adjacent to the LED) do not overlap with the reflection pattern, and the light distribution when turned on is obtained as shown in FIG. 27(B), and the front light distribution is 3.8 cd, which satisfies the vehicle's front light distribution regulations.

FIG. 16 is a modified example of the invention, showing a structure in which a light blocking portion 163 is disposed partially between the resin layer 130 and the second reflective layer 150. The light blocking portion 163 is disposed higher than the upper surface of the resin layer 130. The light blocking portion 163 on the LEDs 101 and 102 is 50% or more of the upper surface area of the LEDs 101 and 102, or is in the range of 50% to 200% of the upper surface area of the LEDs 101 and 102. The light blocking portion 163 may be a region printed with white material. The light blocking portion 163 is printed in a single layer or multiple layers using a reflective ink containing any one of, for example, $TiO_2$, $Al_2O_3$, $CaCO_3$, $BaSO_4$, and Silicon. The light blocking portion 163 reflects light emitted through the emission surface 11 of the LEDs 101 and 102, thereby reducing the occurrence of hot spots. The light blocking portion 163 may print a light blocking pattern using light blocking ink. The light blocking portion 163 may be formed by printing on the lower surface of the second reflective layer 150. The light blocking portion 163 is made of a material that does not 100% block incident light, may have a transmittance lower than a reflectance, and may perform the function of blocking and diffusing light. The light blocking portion 163 may have the same thickness or may have different thicknesses depending on the region. For example, the thickness of the light blocking portion 163 may be thickest in the center region and thinner in the edge region than the center region. The thickness of the light blocking portion 163 increases in proportion to the incident light intensity.

The light blocking portion 163 may reduce the problem of the LEDs 101 and 102 being visible from the outside and reduce hot spots on the region of the LEDs 101 and 102, thereby providing uniform light distribution throughout the entire region. The surrounding region of the light blocking portion 163 is disposed with an adhesive layer 161, which is formed of a transparent resin material and may be adhered between the resin layer 130 and the transparent film 151 of the second reflective layer 150.

FIG. 17 is a modified example of the second reflective layer, in which a second reflective film 153 having a hole 155 on the resin layer 130 and a transparent film 151 may be disposed on the second reflective film 153. The second reflective film 153 may be adhered to the upper surface of the resin layer 130. A through hole may not be formed in the transparent film 151 on a region facing the hole 155. As another example, a through hole (not shown) may be formed in the transparent film 151 on a region facing the hole 155. Accordingly, diffused light may be emitted through the hole 155 or through hole through the transparent film 151.

As shown in FIGS. 18 and 19, the lighting device may be provided as an individual light emitting unit with one column or one LED. These individual light emitting units may be arranged in plural numbers in the row direction, or may be provided as units in which a plurality of LEDs is arranged in the row direction.

As shown in FIG. 18, the lighting device 400 may be provided in a structure in which the thickness of the resin layer 130 gradually becomes thinner as the distance from the LED 101 increases. That is, the thickness of the resin layer 130 disposed on one side (Adjacent region to an LED) of the substrate 110 may be the thickest, and the thickness of the resin layer 130 disposed on the other side (opposite to one side) of the substrate 110 may be the thinnest. At this time, the size of the reflection pattern 123 may become larger as the distance from the LED 101 increases, or may be provided in the same size. Here, the thinnest thickness of the resin layer 130 is less than 1 times the thickest thickness, for example, in the range of 0.3 to 0.9 times, and when it is in this range, light distribution may be uniformly adjusted in the form of a reflection pattern and an arrangement form of holes.

As shown in FIG. 19, the lighting device 400 may be provided in a structure in which the thickness of the resin layer 130 gradually becomes thicker as the distance from the LED 101 increases. That is, the thickness of the resin layer 130 disposed on one side (Adjacent region to an LED) of the substrate 110 may be the thinnest, and the thickness of the resin layer 130 disposed on the other side (opposite to one side) of the substrate 110 may be the thickest. At this time, the size of the reflection pattern 123 may become larger as the distance from the LED 101 increases, or may be provided in the same size. Here, the thickest thickness of the resin layer 130 is 3 times or less the thinnest thickness, for example, in the range of 1.1 to 3 times, and when is in this range, light distribution may be uniformly adjusted in the form of a reflection pattern and an arrangement form of holes. As shown in FIGS. 18 and 19, at least one, at least one column, or two or more of the holes 155 of the second reflective layer 150 may overlap the reflection pattern 123 in the vertical direction. The arrangement form of the reflection pattern 123 and the hole 155 may be selected from the embodiments or modified examples disclosed above.

Referring to FIG. 20, the light source 105 may be disposed to face one side of the resin layer 130. The light source 105 is disposed one or more on the substrate 115 and may face one side of the resin layer 130. Accordingly, since the light source 105 is disposed externally, replacement of the light source 105 may be easy. Additionally, the first reflective layer 120 may be disposed on the support layer 110A under a lower portion of the resin layer 130, and the support layer 110A may be provided as a member without a circuit pattern. The light source 105 may be disposed on one side of the resin layer 130, or may be disposed on one side and the other side, respectively. In the lighting device 400, the arrangement form of the reflection pattern 123 of the first reflective layer 120 and the holes 155 of the second reflective layer 150 may be selected from among the embodiments or modified examples disclosed above.

As shown in FIG. 21, the second reflective layer 150 may include an extension portion 150A extending to the side of the resin layer 130. The extension portion 150A includes a transparent film 151 and a second reflective film 153, and holes 155 may be disposed in the second reflective film 153. The holes 155 of the extension portion 150A may not overlap the reflection pattern 123 in the horizontal or vertical direction. Holes 155 may not be formed in the extension portion 150A.

As shown in FIG. 22, the plurality of LEDs 101 and 102 may be arranged in the same column or different columns, or may be arranged in the same row or different rows. As shown in FIG. 23, at least one or more other LEDs 104 and 106 may be disposed outside between adjacent LEDs 101 and 102.

As shown in FIG. 24, the lighting device may include line holes 155A having a long length in the column direction where the above-described reflection patterns are disposed or in the column direction of the LED. The length of the line hole 155A may be 10% or more of the width (Y-direction length) of the second reflective layer 150, for example, in a range of 50% to 90%. When the length of the line hole 155A is greater than the above range, the light distribution outside the line may have a different distribution than the center of the line. Two or more-line holes 155A may be arranged along each line in the range of 10% to 30% of the width (Y-direction length) of the second reflective layer 150.

Each of the line holes 155A may be arranged along the column of the reflection pattern 123 disclosed above. The width (length in the X-direction) of each of the line holes 155A may become wider as the distance from the LEDs 101 and 102 increases, or may include the same region.

Light distribution at 45 degrees to the left, front, and 45 degrees to the right when turned on and not turned on in the comparative example and the lighting device of the invention will be described. A lighting device will be described as an example in which red light is emitted. As a comparative example, when the light is turned on, red light is emitted in a uniform distribution at 45 degrees to the left, front and 45 degrees to the right, and when the light is not turned on, the left/right drawings may appear the same at 45 degrees to the left, front, and 45 degrees to the right. On the other hand, in the invention, when the light is turned on, the light distribution is uniformly distributed by the holes disclosed above at 45 degrees to the left, front, and 45 degrees to the right, and when the light is not turned on, the holes are not exposed on the external surface images at 45 degrees to the left and right and the external surface at the front, and the image from the front is exposed as another image, such as a metal (Al) image. Accordingly, an image when the light is not turned on may be provided differently according to an angle viewed by the second reflective layer 150, light distribution when the light is turned on may be improved, and the external image when the light is not turned on may be exposed as a surface material of the reflective layer.

When the lighting device 400 is turned on, hole-shaped light extracted through the second reflective layer 150 may form a light distribution, and when not turned on, the surface (e.g., metal surface) of the second reflective layer 150 may be visually recognized, and the holes may be small in size and may not be substantially visually recognized from the outside. Accordingly, when not turned on, a surface image made of the material of the second reflective layer may be improved.

The lighting device 400 according to an embodiment of the invention may surround a region other than the lighting region with a bracket. The bracket may be placed around the lower portion, side walls, and upper portion of the lighting device 400. The lighting device 400 may emit light emitted from the lighting module toward a specific direction. The lighting device 400 may be applied to various lamp devices that require lighting, such as vehicle lamps, household lighting devices, and industrial lighting devices. For example, in the case of lighting modules applied to vehicle lamps, it may be applied to head lamps, side lights, side mirror lights, fog lights, tail lamps, turn signal lamps, back up lamps, stop lamps, daytime running lights, vehicle interior lighting, door scarf, rear combination lamp, backup lamp, etc.

FIG. 25 is a plan view of a vehicle to which a vehicle lamp is applied with a lighting device according to an embodiment, and FIG. 26 is a diagram showing an example of a tail light of a vehicle to which a lighting device according to an embodiment is applied.

Referring to FIGS. 25 and 26, in a moving object or vehicle 900, the front lamp 850 may include one or more lighting devices, and the operating timing of these lighting devices is individually controlled to function as a typical headlamp as well as, when the driver opens the vehicle door, additional functions such as welcome lights or celebration effects may be provided. The lamp may be applied to daytime running lights, high beams, low beams, fog lights, or turn signal lights.

In the vehicle 900, the tail lights 800 may be arranged as a plurality of lamp units 810, 812, 814, and 816 supported by a housing. For example, the lamp units 810, 812, 814, and 816 may include a first lamp unit 810 disposed on one side, a second lamp unit 812 disposed around the outer periphery of the first lamp unit 810, and third and fourth lamp units 814 and 816 respectively disposed inside the second lamp unit 812. The tail light 800 may include the lighting device 400 disclosed in the embodiment disposed inside the third and fourth lamp units 814 and 816, and the lighting device 400 may function as a complex hidden lamp with improved lighting and surface images.

As shown in FIG. 26(A), although the holes 155 are shown to be visible when not turned on, the second reflective film of the second reflective layer is exposed and light may be irradiated through the holes 155 as shown in FIG. 26(B). The color of the light emitted through the holes 155 of the lighting device 400 is different from the color of the vehicle when not turned on, and the surface image of the second reflective layer of the lighting device 400 is the same as the color of the vehicle or has a metal color (aluminum color). Accordingly, it may be provided as a hidden lamp. As another example, the first to fourth lamp units 810, 812, 814, and 816 may selectively apply the lighting device disclosed in the embodiment, and a red lens cover or a white lens cover may be provided on the outside of the lighting device for the lighting characteristics of the lamp units 810, 812, 814, and 816. The lighting device disclosed in the embodiment applied to the lamp units 810, 812, 814, and 816 may irradiate surface light at a higher luminous intensity in a specific direction.

The first and second lamp units 810 and 812 may be provided in at least one of a curved shape, a straight shape, an angled shape, an inclined shape, or a flat shape, or a mixed structure thereof. The first and second lamp units 810 and 812 may be arranged one or more in each taillight. The first lamp unit 810 may be provided as a tail light, the second lamp unit 812 may be provided as a brake light, and the third lamp unit 814 may be provided as a reverse light. The fourth lamp unit 816 may be provided as a turn signal lamp. The tail light 800 may provide at least one of a sidelight, a brake light, and a turn signal light using the lighting device disclosed in the embodiment of the invention.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention.

In addition, although the embodiments have been mainly described above, this is only an example and does not limit the present invention, and one of ordinary skill in the field to which the present invention belongs will appreciate that various modifications and applications not illustrated above may be possible without departing from the essential characteristics of the present embodiment. For example, each component specifically shown in the embodiment can be implemented by modification. And differences related to such modifications and applications should be construed as being included in the scope of the invention defined in the appended claims.

The invention claimed is:

1. A lighting device comprising:
a substrate;
a first reflective layer disposed on the substrate and having a plurality of reflection patterns;
a light source disposed on the substrate;
a resin layer disposed on the first reflective layer; and
a second reflective layer disposed on the resin layer and having a plurality of holes,
wherein an arrangement form of the plurality of holes is a same as an arrangement form of the plurality of reflection patterns,
wherein the plurality of reflection patterns and the plurality of holes overlap in one region in a direction perpendicular to an upper surface of the substrate,
wherein a size of at least one of the holes is smaller than a size of at least one of the reflection patterns in the overlapping region, and
wherein the plurality of holes include a region where a size of the holes increases as a distance from the light source in an emission direction of the light source increases.

2. The lighting device of claim 1,
wherein the arrangement form of the plurality of holes includes n columns,
wherein the arrangement form of the plurality of reflection patterns includes m columns,
wherein m and n are integers of one or more and are a same or different from each other.

3. The lighting device of claim 1,
wherein the plurality of holes includes a first hole and a second hole in a first column among n columns, and a first hole and a second hole in a second column among the n columns,
wherein an interval between the first hole and the second hole in the first column is equal to or smaller than an interval between the first hole in the first column and the first hole in the second column,
wherein the first column is disposed closer to an emission surface of the light source than the second column.

4. The lighting device of claim 1,
wherein the first reflective layer includes a first reflective film,
wherein the plurality of reflection patterns is disposed on the first reflective film,
wherein the plurality of reflection patterns is covered with a lower portion of the resin layer.

5. The lighting device of claim 1,
wherein the second reflective layer includes a transparent film and a second reflective film disposed on the transparent film,
wherein the plurality of holes is penetrated through the second reflective film,
wherein the second reflective film includes a metal film having the plurality of holes.

6. The lighting device of claim 1,
wherein the plurality of reflection patterns includes a region where a size of the reflection patterns increases as a distance from the light source in an emission direction of the light source increases, wherein a total area of the plurality of holes is smaller than a total area of a reflective region of the second reflective layer.

7. The lighting device of claim 1,
wherein the light source includes a plurality of LEDs,
wherein the plurality of LEDs is arranged to emit light in a first direction.

8. The lighting device of claim 1,
wherein the light source includes a plurality of LEDs,
wherein the plurality of LEDs includes a first LED to emit light in a first direction, and a second LED to light a second direction opposite to the first direction,
wherein a number or size of the plurality of holes disposed adjacent to an emission surface of the first LED is different from a number or size of the plurality of holes disposed adjacent to an emission surface of the second LED.

9. The lighting device of claim 1,
wherein a thickness of the resin layer is 2.7 mm or less,
wherein the lighting device emits red light.

10. The lighting device of claim 1,
wherein an overlap ratio between the plurality of holes and the plurality of reflective patterns ranges from 60% to 98% in the direction perpendicular to the upper surface of the substrate.

11. A lighting device comprising:
a substrate;
a first reflective layer disposed on the substrate and having a plurality of reflection patterns;
a light source disposed on the substrate;
a resin layer disposed on the first reflective layer;
a second reflective layer disposed on the resin layer and having a plurality of holes,
wherein the plurality of holes includes a region where a number of holes per unit area increases as a distance from the light source in an emission direction of the light source increases,
wherein the plurality of reflection patterns and the plurality of holes overlap in one region in a direction perpendicular to an upper surface of the substrate, and
wherein a size of at least one of the holes is smaller than a size of at least one of the reflection patterns in the overlapping region.

12. The lighting device of claim 11,
wherein each of the plurality of holes is a same size,
wherein each of the plurality of reflection patterns is a same size,
wherein the plurality of reflection patterns includes a region where a number of reflection patterns per unit area increases as a distance from the light source in an emission direction of the light source increases.

13. The lighting device of claim 11,
wherein each of the plurality of holes is a same size,
wherein the plurality of reflection patterns includes a region where a size of the reflection patterns increases as a distance from the light source in an emission direction of the light source increases.

14. The lighting device of claim 11,
wherein the first reflective layer includes a first reflective film,
wherein the plurality of reflection patterns is disposed on the first reflective film,
wherein the plurality of reflection patterns is covered with a lower portion of the resin layer.

15. The lighting device of claim 14,
wherein the second reflective layer includes a transparent film and a second reflective film disposed on the transparent film,
wherein the plurality of holes is penetrated through the second reflective film.

16. The lighting device of claim 15,
wherein the second reflective film includes a metal film.

17. A lighting device comprising:
a first reflective layer having a plurality of reflection patterns;
a second reflective layer having a plurality of holes;
a resin layer disposed between the first reflective layer and the second reflective layer; and
a light source that provides light to an inside or outside of the resin layer,
wherein the second reflective layer includes a region in which at least one of a size or an interval of the holes changes as a distance from the light source in an emission direction of the light source increases,
wherein the second reflective layer includes a reflective film having the plurality of holes on the resin layer,
wherein the plurality of holes penetrates from an upper surface of the reflective film toward the resin layer,
wherein at least one or at least one column of the plurality of holes overlaps at least one of the reflection patterns in a vertical direction,
wherein the reflective film is made of metal,
wherein the size of at least one of the holes is 20 times or less than a wavelength emitted from the light source,
wherein the plurality of holes has an overlap ratio of 50% or more with the plurality of reflection patterns, and
wherein at least one of the plurality of holes has an overlap ratio with vertically overlapping at least one of the reflection patterns in a range of 1% to 100%.

18. The lighting device of claim 17,
wherein a thickness of the resin layer is 2.7 mm or less,
wherein the lighting device emits red light.

* * * * *